United States Patent
Iso et al.

(10) Patent No.: US 8,614,636 B2
(45) Date of Patent: Dec. 24, 2013

(54) DATA PROCESSING DEVICE AND DATA PROCESSING SYSTEM

(75) Inventors: Yoshimi Iso, Tokyo (JP); Kakeru Kimura, Tokyo (JP); Tadashi Matsushima, Tokyo (JP); Yuji Shimizu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 200 days.

(21) Appl. No.: 13/279,076

(22) Filed: Oct. 21, 2011

(65) Prior Publication Data

US 2012/0062403 A1 Mar. 15, 2012

Related U.S. Application Data

(63) Continuation of application No. 12/730,978, filed on Mar. 24, 2010, now Pat. No. 8,077,065.

(30) Foreign Application Priority Data

Mar. 31, 2009 (JP) .................................. 2009-084822
Sep. 29, 2009 (JP) .................................. 2009-223765

(51) Int. Cl.
 *H03M 1/06* (2006.01)
(52) U.S. Cl.
 USPC ............ 341/118; 341/120; 341/139; 341/155
(58) Field of Classification Search
 USPC .................................. 341/118, 120, 139, 155
 See application file for complete search history.

(56) References Cited

U.S. PATENT DOCUMENTS

| | | | |
|---|---|---|---|
| 5,006,851 A | 4/1991 | Kaneaki et al. | |
| 5,422,643 A * | 6/1995 | Chu et al. | ...................... 341/141 |
| 6,445,319 B1 * | 9/2002 | Bugeja | .......................... 341/138 |
| 6,720,902 B2 | 4/2004 | Stimmann | |
| 7,146,283 B2 | 12/2006 | Daigle et al. | |

FOREIGN PATENT DOCUMENTS

| | | |
|---|---|---|
| JP | H02-27813 A | 1/1990 |
| JP | 2000-174622 A | 6/2000 |
| JP | 2001-102927 A | 4/2001 |

OTHER PUBLICATIONS

Japanese Office Action dated Jul. 11, 2013 issued in counterpart Japanese Application No. 2009-223765.

* cited by examiner

*Primary Examiner* — Khai M Nguyen
(74) *Attorney, Agent, or Firm* — Miles & Stockbridge P.C.

(57) ABSTRACT

In AD conversion of a voltage, data continuity is ensured between the results of conversion after amplification and of direct conversion without amplification. In AD conversion operation, an analog signal output from a DA converter circuit is directly converted by an AD converter circuit, and the analog signal is converted after amplification with an expected gain of $2^n$. Based on resultant data, a gain of an amplifier circuit and an offset thereof are calculated. An analog signal to be enhanced in bit precision is amplified by the amplifier circuit and converted by the AD converter circuit, the offset is subtracted from the resultant conversion, and the result is multiplied by a ratio of the expected gain to the calculated gain to cancel gain error. Based on data with gain error canceled, acquisition of bit-extended conversion result data is performed to ensure continuity between data having different degrees of bit precision.

4 Claims, 16 Drawing Sheets

FIG. 4

(6-bit RESOLUTION IS ACHIEVED BY USING 4-bit ADC AND
5-FOLD GAIN AMP. OFFSET IS TAKEN INTO ACCOUNT HERE.)

| WITHOUT Amp | x5Amp+1LSB | (D-1)/5*4 | | |
|---|---|---|---|---|
| 15  1111 | 10000 DAC3 | 1100 | 15 | 1111 |
| 14  1110 | 1111 | 1011 | 14 | 1110 |
| 13  1101 | 1110 | 1010 | 13 | 1101 |
| 12  1100 | 1101 | 1010 | 12 | 1100 |
| 11  1011 | 1100 | 1001 | 11 | 1011 |
| 10  1010 | 1011 | 1000 | 10 | 1010 |
| 9  1001 | 1010 | 0111 | 9 | 1001 |
| 8  1000 | 1001 | 0110 | 8 | 1000 |
| 7  0111 | 1000 | 0110 | 7 | 0111 |
| 6  0110 | 0111 | 0101 | 6 | 0110 |
| 5  0101 | 0110 | 0100 | 5 | 0101 |
| 4  0100 | 0101 | 0011 | 4 | 0100 |
| 3  0011 DAC3 | 0100 | 0010 | 3 | 001100 |
| 2  0010 | 0011 | 0010 | 2.75 | 001011 |
| 1  0001 | 0010 | 0001 | 2.5 | 001010 |
| 0  0000 DAC0 | 0001 DAC0 | 0000 | 2.25 | 001001 |
| | | | 2 | 001000 |
| | | | 1.75 | 000111 |
| | | | 1.5 | 000110 |
| | | | 1.25 | 000101 |
| | | | 1 | 000100 |
| | | | 0.75 | 000011 |
| | | | 0.5 | 000010 |
| | | | 0.25 | 000001 |
| | | | 0 | 000000 |

4-bit PRECISION (rows 4–15)

6-bit PRECISION (rows 0–3)

FIG. 5

(6-bit RESOLUTION IS ACHIEVED BY USING 4-bit ADC, AND 4-FOLD GAIN AMP. OFFSET IS NOT TAKEN INTO ACCOUNT HERE.)

| WITHOUT Amp | x4Amp | | |
|---|---|---|---|
| 15  1111 | 1111 | 15   1111 | ⎫ |
| 14  1110 | 1110 | 14   1110 | ⎬ 4-bit |
| 13  1101 | 1101 | 13   1101 | ⎬ PRECISION |
| 12  1100 | 1100 | 12   1100 | ⎬ |
| 11  1011 | 1011 | 11   1011 | ⎬ |
| 10  1010 DAC2 | 1010 | 10   1010 | ⎭ |
| 9   1001 | 1001 | 9.75  100111 | ⎫ |
| 8   1000 DAC0 | 1000 DAC0 | 9.5   100110 | |
| 7   0111 | 0111 | 9.25  100101 | |
| 6   0110 DACm2 | 0110 | 9    100100 | |
| 5   0101 | 0101 | 8.75  100011 | |
| 4   0100 | 0100 | 8.5   100010 | |
| 3   0011 | 0011 | 8.25  100001 | |
| 2   0010 | 0010 | 8    100000 | ⎬ 6-bit |
| 1   0001 | 0001 | 7.75  011111 | ⎬ PRECISION |
| 0   0000 | 0000 DACm2 | 7.5   011110 | |
| | | 7.25  011101 | |
| | | 7    011100 | |
| | | 6.75  011011 | |
| | | 6.5   011010 | |
| | | 6.25  011001 | |
| | | 6    0110 | ⎭ |
| | | 5    0101 | ⎫ |
| | | 4    0100 | ⎬ |
| | | 3    0011 | ⎬ 4-bit |
| | | 2    0010 | ⎬ PRECISION |
| | | 1    0001 | ⎬ |
| | | 0    0000 | ⎭ |

DATA PROCESSING DEVICE AND DATA PROCESSING SYSTEM

CROSS-REFERENCE TO RELATED APPLICATIONS

This application is a continuation of application Ser. No. 12/730,978 filed Mar. 24, 2010 now U.S. Pat. No. 8,077,065. The disclosures of Japanese Patent Application No. 2009-84822 filed on Mar. 31, 2009 and Japanese Patent Application No. 2009-223765 filed on Sep. 29, 2009 each including the specification, drawings and abstract are incorporated herein by reference in its entirety.

BACKGROUND OF THE INVENTION

The present invention relates to a data processing device having an analog-to-digital (AD) conversion function, and more particularly to a technique for enhancing the degree of conversion bit precision (resolution) in small-signal operation with respect to an AD conversion range.

In Patent Documents 1 and 2 indicated below, there are disclosed techniques for acquiring AD conversion result data having a higher degree of bit precision than that of an AD converter circuit.

According to the Patent Document 1, an AD converter device is so arranged that an input voltage is compared with a voltage obtained through DA conversion of AD-converted data of the input voltage to determine a difference voltage, which is then amplified and converted to prepare AD-converted data. Through addition of these AD-converted data, it is allowed to provide AD conversion result data having a higher level of resolution than that of an AD converter circuit. For DA conversion in the AD converter device, a PWM-type DA converter is used to improve the linearity of DA conversion characteristic for the purpose of enhancing low-order bit precision in AD conversion. A PWM circuit section in the AD converter device generates and outputs a PWM signal having a duty factor corresponding to AD-converted data of a sample-and-hold voltage VA, and the PWM signal thus output is smoothed through a lowpass filter to provide an analog voltage VD. Then, in a differential amplifier, a difference voltage between the sample-and-hold voltage VA and the analog voltage VD is amplified through multiplication by "2 to the 'n'-th power" for output therefrom, and under the direction of a control section, AD-converted data of the difference voltage thus amplified is synthesized with AD-converted data of the sample-and-hold voltage, thereby providing AD conversion result data having a resolution level that is higher by "n" bits than that of the AD converter circuit.

According to the Patent Document 2, it is intended to provide an AD converter circuit device wherein, using an AD converter circuit thereof, digital signals having the number of output bits larger than that of the AD converter circuit are produced. In operation of the AD converter circuit disclosed in the Patent Document 2, when an input signal to the AD converter circuit has a value higher than or equal to a predetermined point, the input signal is amplified by an amplifier circuit, and then the resultant amplified signal is converted to a "C"-bit digital signal through the AD converter circuit. Thereafter, through a latch circuit, the "C"-bit digital signal is converted to a "C+a/6"-bit digital signal, which is then output from the AD converter circuit via a data selector. Contrastingly, when an input signal has a value lower than the predetermined point, the input signal is amplified by the amplifier circuit, and then the resultant amplified signal is converted to a "C"-bit digital signal through the AD converter circuit in the same manner as mentioned above. Thereafter, through a data interpolating circuit, the "C"-bit digital signal is converted to a "C+a/6"-bit digital signal, which is then output from the AD converter circuit via the latch circuit and data selector.

Patent Document 1:
Japanese Unexamined Patent Publication No. 2001-102927
Patent Document 2:
Japanese Unexamined Patent Publication No. 2000-174622

SUMMARY OF THE INVENTION

In conventional practice of AD conversion of a low-level voltage under measurement, an input signal corresponding thereto is amplified by an amplifier circuit and then AD-converted to provide higher precision in conversion. This conventional practice is, however, disadvantageous in that data continuity may not be ensured between the result of conversion after amplification by using the amplifier circuit and the result of direct conversion without using the amplifier circuit. A gain error and offset of the amplifier circuit are the causes of the disadvantageous phenomenon mentioned above. In practical applications according to the techniques disclosed in the Patent Documents 1 and 2, it is required to adjust a gain error and offset of the amplifier circuit for preventing adverse effects thereof.

It is therefore an object of the present invention to provide an arrangement wherein, in AD conversion of a voltage under measurement, data continuity can be easily ensured between the result of conversion after amplification by using an amplifier circuit and the result of direct conversion without using the amplifier circuit.

Another object of the present invention is to provide an arrangement wherein, in AD conversion of a voltage under measurement, data continuity can be easily ensured, without resorting to a high-precision-type amplifier circuit, between the result of conversion after amplification by using the amplifier circuit and the result of direct conversion without using the amplifier circuit.

The above and other objects, features and advantages of the present invention will become more apparent from the following detailed description with reference to the accompanying drawings.

Representative aspects of the present invention are briefed below:

In carrying out the present invention and according to one aspect thereof, there is provided an arrangement wherein, in AD conversion operation using a DA converter circuit, an amplifier, and an AD converter circuit under the direction of a control circuit, an analog signal output from the DA converter circuit is directly converted by the AD converter circuit, and also the analog signal is converted therein after amplified by the amplifier circuit with an expected gain of $2^n$ ("n" represents a positive integer). Based on resultant data thus obtained, a gain of the amplifier circuit and an offset thereof are calculated. An analog signal under measurement to be enhanced in bit precision is subjected to amplification by the amplifier circuit and conversion by the AD converter circuit, the offset calculated as mentioned above is subtracted from the result of the conversion, and the result of the subtraction thus performed is multiplied by a ratio of the expected gain to the gain calculated as mentioned above so as to cancel a gain error. Then, for ensuring continuity between data having different degrees of bit precision, the number of bits in data with the gain error canceled is increased by "n" bits in bit extension processing operation.

With the above-mentioned technique according to the present invention, data continuity can be ensured between conversion result data enhanced to have a higher degree of bit precision after cancellation of an error due to an amplifier circuit and direct conversion result data obtained without using the amplifier circuit.

Summarized below are advantageous effects to be provided according to the representative aspects of the present invention:

In AD conversion where the degree of conversion bit precision is varied after amplification of a voltage under measurement, data continuity can be easily ensured, without the need for error-calibration of an amplifier circuit, between the result of conversion after amplification by using the amplifier circuit and the result of direct conversion without using the amplifier circuit.

BRIEF DESCRIPTION OF THE DRAWINGS

FIG. 4 is an explanatory diagram showing an example of bit-precision-variable AD conversion processing for achieving 6-bit resolution under the conditions that there are provided a 4-bit level of conversion precision in an ADC and a 4-fold expected gain in a PGA with offset taken into account;

FIG. 5 is an explanatory diagram showing an example of bit-precision-variable AD conversion processing for achieving 6-bit resolution under the conditions that there are provided a 4-bit level of conversion precision in an ADC and a 4-fold expected gain in a PGA with offset not taken into account in a case where the midpoint of a conversion range is used as a measurement reference point;

DETAILED DESCRIPTION OF THE PREFERRED EMBODIMENTS

1. Overviews of the Preferred Embodiments

Figure 1:
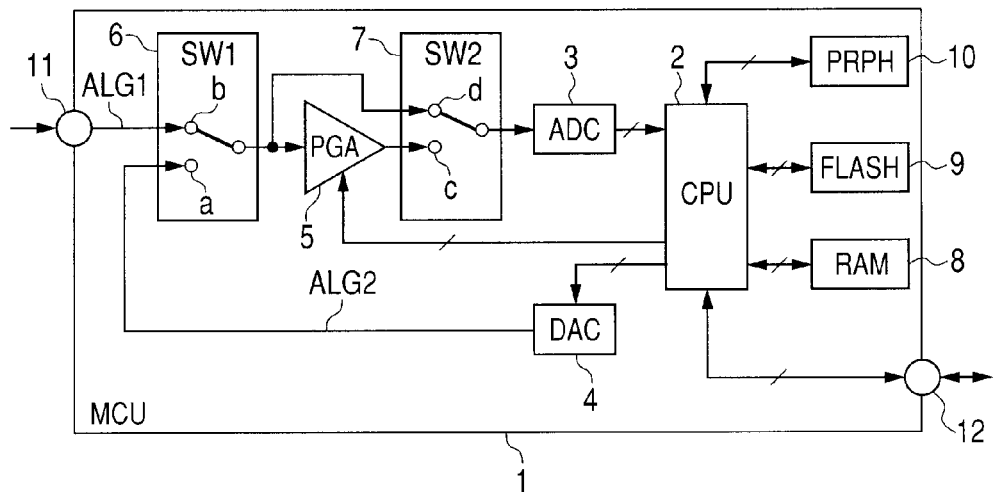
FIG. 1 is a block diagram of a microcomputer in a first preferred embodiment of an AD conversion system according to the present invention.

First, the present invention will be described below regarding the overviews of representative preferred embodiments thereof. It is to be noted that, in the following description of the overviews of the representative preferred embodiments, parenthesized reference numerals are used for illustrative purposes only and designate respective parts that are included in the concepts of corresponding component elements identified with reference numerals in the accompanying drawings.

[1] According to one representative preferred embodiment of the present invention, a data processing device (1) comprises a DA converter circuit (4), an amplifier circuit (5), an AD converter circuit (3), and a control circuit (2). The control circuit is so designed as to control calibration processing and bit-precision-variable AD conversion processing for the amplifier circuit with an expected gain of $2^n$ ("n" represents a positive integer). In execution of the calibration processing, a gain of the amplifier circuit is calculated based on data obtained by amplifying an analog signal output from the DA converter circuit through use of the amplifier circuit and then converting the thus amplified analog signal through conversion by the AD converter circuit, and also based on data obtained by converting the analog signal through conversion by the AD converter circuit without amplification thereof by the amplifier circuit. In execution of the bit-precision-variable AD conversion processing, an analog signal amplified by the amplifier circuit with respect to an analog signal under measurement to be enhanced in bit precision is converted by the AD converter circuit, and the result of the conversion is multiplied by a ratio of the expected gain to the gain calculated through the processing mentioned above so as to cancel a gain error. Then, based on data with the gain error canceled, acquisition of bit-extended conversion result data is performed to ensure continuity between data having different degrees of bit precision.

[2] In the data processing device according to item 1, the bit-precision-variable AD conversion processing is put into execution in the following manner: An analog signal amplified by the amplifier circuit with respect to an analog signal under measurement to be enhanced in bit precision is converted by the AD converter circuit, and the result of the conversion is multiplied by a ratio of the expected gain to the gain calculated through the calculation mentioned above so as to cancel a gain error. Then, bit extension processing is performed on data with the gain error canceled to ensure continuity between data having different degrees of bit precision.

[3] In the data processing device according to item 2, the number of extended bits in the bit extension processing is represented as "n".

[4] According to another representative preferred embodiment of the present invention, a data processing device (1) comprises a DA converter circuit (4), an amplifier circuit (5), an AD converter circuit (3), and a control circuit (2). The control circuit is so designed as to control calibration processing and bit-precision-variable AD conversion processing for the amplifier circuit with an expected gain of $2^n$ ("n" represents a positive integer). In execution of the calibration processing, a gain of the amplifier circuit and an offset thereof are calculated based on data obtained by amplifying an analog signal output from the DA converter circuit through use of the amplifier circuit and then converting the thus amplified analog signal through conversion by the AD converter circuit, and also based on data obtained by converting the analog signal through conversion by the AD converter circuit without amplification thereof by the amplifier circuit. In execution of the bit-precision-variable AD conversion processing, an analog signal amplified by the amplifier circuit with respect to an analog signal under measurement to be enhanced in bit precision is converted by the AD converter circuit, the offset calculated through the processing mentioned above is subtracted from the result of the conversion, and the result of the subtraction thus performed is multiplied by a ratio of the expected gain to the gain calculated through the processing mentioned above so as to cancel a gain error. Then, based on data with the gain error canceled, acquisition of bit-extended conversion result data is performed to ensure continuity between data having different degrees of bit precision.

[5] In the data processing device according to item 4, the bit-precision-variable AD conversion processing is put into execution in the following manner: An analog signal amplified by the amplifier circuit with respect to an analog signal under measurement to be enhanced in bit precision is converted by the AD converter circuit, the offset calculated through the calibration processing is subtracted from the result of the conversion, and the result of the subtraction thus performed is multiplied by a ratio of the expected gain to the gain calculated through the calibration processing so as to cancel a gain error. Then, bit extension processing is performed on data with the gain error canceled to ensure continuity between data having different degrees of bit precision.

[6] In the data processing device according to item 5, the number of extended bits in the bit extension processing is represented as "n".

[7] In the data processing device according to item 3 or 6, the bit extension processing is put into execution in the following manner: When a range to be enhanced in bit precision has a reference point thereof at "0", an increase of "n" bits is made on the highest-order bit position side of the data with the gain error canceled, for example. Thus, bit "0" extension is made through the bit extension processing as exemplified in FIGS. 3 and 4. It is to be noted that the calculation technique described here is exemplary only and that a modification may be made therein as required.

[8] In the data processing device according to item 3 or 6, the bit extension processing is put into execution in the following manner: When a range to be enhanced in bit precision has a reference point thereof at an intermediate range position of conversion, a difference between data at the reference point and the data with the gain error canceled is added to data obtained by shifting the data at the reference point to the left by "n"-bit positions, for example, as demonstrated in FIG. 5. It is to be noted that the calculation technique described here is exemplary only and that a modification may be made therein as required.

[9] In the data processing device according to item 1 or 4, the amplifier circuit is arranged as a programmable gain amplifier (5) in which a gain thereof can be varied under the direction of the control circuit.

[10] The data processing device according to item 1 or 4 is formed over one semiconductor substrate.

[11] In the data processing device according to item 10, the control circuit is arranged as a CPU (2) that carries out control operations by means of program execution.

[12] The data processing device according to item 11 further comprises a rewritable nonvolatile memory (9) in which measurement result data obtained through the calibration processing is stored under the control of the CPU.

[13] The data processing device according to item 12 further comprises an analog input port (11) for receiving an analog signal under measurement from an external circuit.

[14] In the data processing device according to item 1 or 4, the control circuit is further arranged to control bit-precision-constant AD conversion processing without using the amplifier circuit and bit-precision-constant AD conversion processing by using the amplifier circuit.

[15] According to another preferred embodiment of the present invention, there is provided a data processing system comprising a DA converter circuit (3), at least one amplifier circuit (5, 5A to 5D, 40), an AD converter circuit (4), and at least one control circuit (2, 2 and 20, 2 and 20A, 2 and 20B).

The control circuit is so designed as to control calibration processing and AD conversion processing for the amplifier circuit. In execution of the calibration processing, the control circuit conducts the following operation: A gain (G) of the amplifier circuit is calculated based on data obtained by amplifying an analog signal output from the DA converter circuit through use of the amplifier circuit and then converting the thus amplified analog signal through conversion by the AD converter circuit, and also based on data obtained by converting the analog signal through conversion by the AD converter circuit without amplification thereof by the amplifier circuit. In execution of the AD conversion processing, the control circuit conducts the following operation: An analog signal amplified by the amplifier circuit with respect to a prespecified analog signal under measurement is converted by the AD converter circuit, and the result of the conversion is adjusted to a size corresponding to "one divided by the gain calculated as mentioned above" (1/G) for enhancement in bit precision in conversion result data.

[16] In the data processing system according to item 15, the amplifier circuit provides a gain value larger than "1" (5, 5A to 5D).

[17] In the data processing system according to item 15, the amplifier circuit provides a gain value smaller than "1" (40).

[18] In the data processing system according to item 15, the prespecified analog signal under measurement is a small signal limited within a predetermined range with respect to a conversion range of the AD converter circuit.

Figure 13:
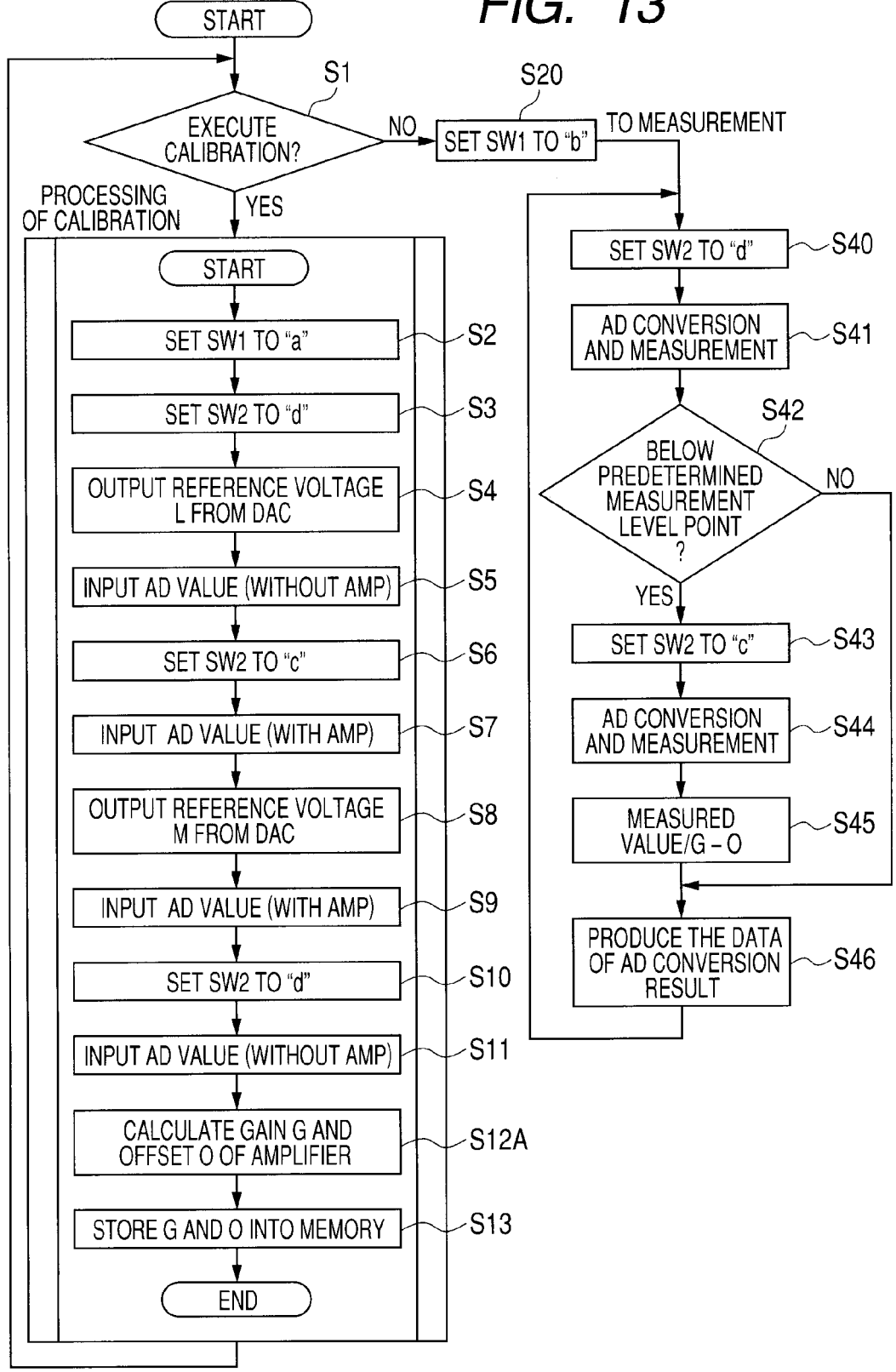
FIG. 13 is a flowchart showing a processing procedure for carrying out the alternate-sampling AD conversion operation shown in FIG. 12.

[19] In the data processing system according to item 15, the control circuit carries out AD conversion processing in the following manner: When data obtained through conversion by the AD converter circuit without amplification thereof by the amplifier circuit is judged to meet the prespecified analog signal under measurement, an analog signal amplified by the amplifier circuit is sampled and converted by the AD converter circuit. Then, the result of the conversion is adjusted to a size corresponding to "one divided by the gain calculated as mentioned above" for enhancement in bit precision in conversion result data (FIG. 13).

Figure 17:
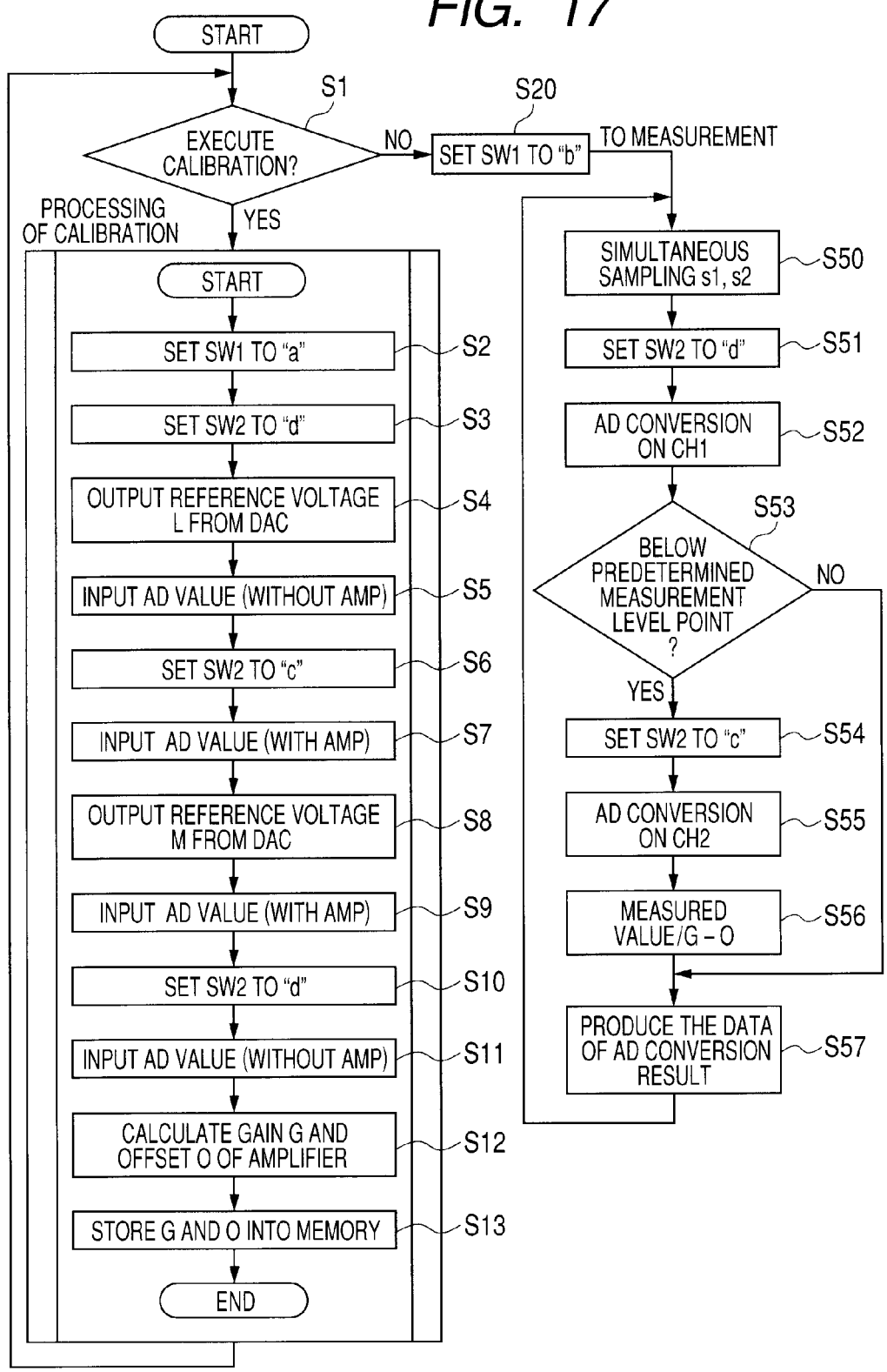
FIG. 17 is a flowchart showing a processing procedure for carrying out the simultaneous-sampling AD conversion operation shown in FIG. 16.

[20] In the data processing system according to item 15, the control circuit carries out AD conversion processing also in the following manner: Respective analog signals under measurement that are not recognized as having been amplified by the amplifier circuit are sampled in parallel. When data obtained through conversion by the AD converter circuit without amplification thereof by the amplifier circuit is judged to meet the prespecified analog signal under measurement, an analog signal amplified by the amplifier circuit and subjected to sampling is converted by the AD converter circuit. Then, the result of the conversion is adjusted to a size corresponding to "one divided by the gain calculated as mentioned above" for enhancement in bit precision in conversion result data (FIG. 17).

[21] According to another preferred embodiment of the present invention, there is provided a data processing system comprising a DA converter circuit (3), at least one amplifier circuit (5, 5A to 5D, 40), an AD converter circuit (4), and at least one control circuit (2, 2 and 20, 2 and 20A, 2 and 20B). The control circuit is so designed as to control calibration processing and AD conversion processing for the amplifier circuit. In execution of the calibration processing, the control circuit conducts the following operation: A gain (G) of the amplifier circuit and an offset (O) thereof are calculated based on data obtained by amplifying an analog signal output from the DA converter circuit through use of the amplifier circuit and then converting the thus amplified analog signal in the AD converter circuit, and also based on data obtained by converting the analog signal through conversion by the AD converter circuit without amplification thereof by the amplifier circuit. In execution of the AD conversion processing, the control circuit conducts the following operation: An analog signal amplified by the amplifier circuit with respect to a prespecified analog signal under measurement is converted by the AD converter circuit, the result of the conversion is adjusted to a size corresponding to "one divided by the gain calculated as mentioned above" (1/G), and further the offset calculated as mentioned above is subtracted from the thus adjusted result of the conversion for enhancement in bit precision in conversion result data.

[22] In the data processing system according to item 21, the amplifier circuit provides a gain value larger than "1" (5, 5A to 5D).

[23] In the data processing system according to item 21, the amplifier circuit provides a gain value smaller than "1" (40).

[24] In the data processing system according to item 21, the prespecified analog signal under measurement is a small signal limited within a predetermined range with respect to a conversion range of the AD converter circuit.

[25] In the data processing system according to item 21, the control circuit carries out AD conversion processing in the following manner: When data obtained through conversion by the AD converter circuit without amplification thereof by the amplifier circuit is judged to meet the prespecified analog signal under measurement, an analog signal amplified by the amplifier circuit is sampled and converted by the AD converter circuit. Then, the result of the conversion is adjusted to a size corresponding to "one divided by the gain calculated as mentioned above", and further the offset calculated as mentioned above is subtracted from the thus adjusted result of the conversion for enhancement in bit precision in conversion result data (FIG. 13).

[26] In the data processing system according to item 21, the control circuit carries out AD conversion processing also in the following manner: Respective analog signals under measurement that are not recognized as having been amplified by the amplifier circuit are sampled in parallel. When data obtained through conversion by the AD converter circuit without amplification thereof by the amplifier circuit is judged to meet the prespecified analog signal under measurement, an analog signal amplified by the amplifier circuit and subjected to sampling is converted by the AD converter circuit. Then, the result of the conversion is adjusted to a size corresponding to "one divided by the gain calculated as mentioned above", and the offset calculated as mentioned above is subtracted from the thus adjusted result of the conversion for enhancement in bit precision in conversion result data (FIG. 17).

2. Details of the Preferred Embodiments

The following further describes details of the preferred embodiments of the present invention.

<First Preferred Embodiment of AD Conversion System>

Referring to FIG. 1, there is shown a microcomputer arrangement in a first preferred embodiment according to the present invention. A microcomputer (MCU) 1 illustrated in FIG. 1 is arranged to provide an AD conversion system. The microcomputer 1 is formed over a semiconductor substrate made of single-crystal silicon or the like by such a semiconductor device manufacturing technique as a complementary MOS integrated circuit fabrication technique, though not particularly limited thereto. In the microcomputer 1, there are included a central processing unit (CPU) 2 serving as a control circuit for program execution, a nonvolatile memory (FLASH) 9 such as a flash memory for storing programs and data in an electrically rewritable manner, a RAM 8 used as a working memory area for the CPU 2 or the like, an AD converter circuit (ADC) 3 for converting an analog signal to a digital signal, a DA converter circuit (DAC) 4 for converting a digital signal to an analog signal, a digital input/output port 12, an analog input port 11, and a peripheral circuit module (PRPH) 10 including a timer-counter, serial interface, and other peripheral circuits. The microcomputer 1 further comprises a programmable gain amplifier (PGA) 5 in which a gain setting for amplification can be changed for varying the degree of conversion bit precision through amplification of a voltage under measurement and AD conversion thereof, a selector (SW1) 6, and a selector (SW2) 7. In execution of AD conversion processing, by using these component elements in combination with the ADC 3 and DAC 4 mentioned above, the CPU 2 performs program control of conversion operations. The following describes in detail AD conversion functionality for varying the degree of conversion bit precision.

Under the control of the CPU 2, the selector 6 selects an analog signal ALG1 under measurement that is input from the analog input port 11 or an analog signal ALG2 that is fed from the DAC 4. The PGA 5 amplifies an output signal from the selector 6, and a gain in this amplification is controlled by the CPU 2. Then, under the control of the CPU 2, the selector 7 selects an output signal from the selector 6 or an output signal from the PGA 5. The signal selected by the selector 7 is input to the ADC 3 for AD conversion therein. Calculation on the result of AD conversion by the ADC 3 and AD conversion control operation therein are carried out under program control of the CPU 2. Likewise, data generation for DA conversion by the DAC 4 and DA conversion control operation therein are also carried out under program control of the CPU 2.

In execution of AD conversion, the CPU 2 controls calibration processing and bit-precision-variable AD conversion processing for the PGA 5.

In the calibration processing, the CPU 2 sets up a gain in the PGA 5. In the present specification document, a target value of gain to be set up is referred to as an expected gain, which has a value of $2^n$ ("n" represents a positive integer). After an expected gain is set up, a predetermined digital value (DGT1) is converted to an analog signal ALG2 in the DAC 4, and then the resultant analog signal ALG2 is amplified by the PGA 5. Thereafter, in the ADC 3, an amplified output from the PGA 5 is converted to a digital value (DGT2). In addition to the processing mentioned above, the analog signal ALG2 is converted to a digital value (DGT3) through AD conversion by the ADC 3 without amplification thereof by the PGA 5. Based on the digital values DGT1, DGT2, and DGT3, an actual gain of the PGA 5 and an offset thereof are calculated. For example, in a case where "n=0" (1-fold gain in amplification by the PGA 5), an offset of the PGA 5 can be calculated based on the relationship between the digital values DGT1 and DGT2. Further, in a case where "n=2" (4-fold gain in amplification by the PGA 5), i.e., any significant gain is specified for the PGA 5, an actual gain (actually measured gain) provided in the PGA 5 can be determined based on the relationship between the digital values DGT2 and DGT3. The offset and measured gain values thus obtained are then stored into the nonvolatile memory 9. It is just required to execute the calibration processing mentioned above at the time of power-on resetting of the microcomputer 1, for example. Thereafter, through periodic execution of the calibration processing, the offset and measured gain values may be updated for storing data in conformity with variations due to such a factor as temperature.

Figure 2:
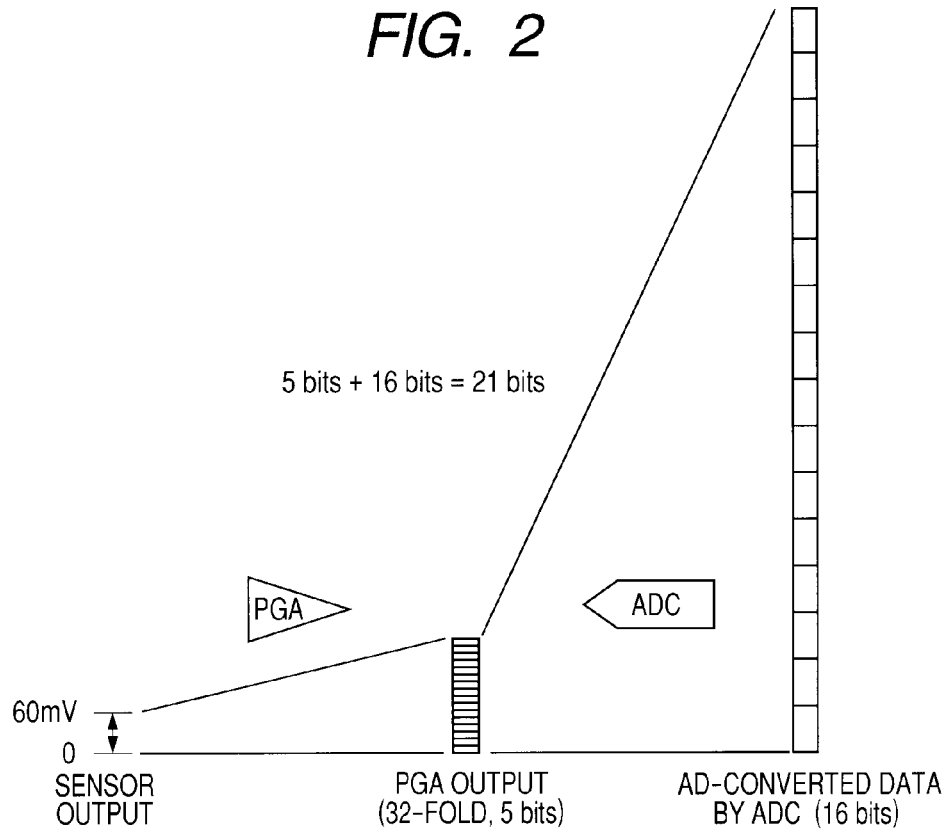
FIG. 2 is an explanatory diagram illustrating the concept of bit-precision-variable AD conversion processing.

FIG. 2 illustrates the concept of the bit-precision-variable AD conversion processing. In the scheme based on this concept, the PGA 5 amplifies the input analog signal ALG1, which is a small signal having such a low measurement voltage as 60 mV with respect to a voltage range applicable to AD conversion, and the analog signal thus amplified is subjected to AD conversion by the ADC 3. For example, in an instance where the degree of conversion bit precision for output from the ADC 3 with respect to input thereto is 16 bits and where the input analog signal ALG1 is amplified 32-fold in the PGA 5, the degree of bit precision in AD conversion by the ADC 3 appears to be 21 bits with respect to the input analog signal ALG1. It is of particular importance to ensure continuity between data having different degrees of bit precision, i.e., continuity between the result of AD conversion operation within small-signal range limitation after amplification by the PGA 5, and the result of direct AD conversion operation in excess of small-signal range limitation without amplification by the PGA 5. The CPU 2 carries out calculations for ensuring data continuity. More specifically, in the bit-precision-variable AD conversion processing, the PGA 5 amplifies the analog signal ALG1 under measurement, which is a small signal to be enhanced in bit precision, and then the analog signal thus amplified is subjected to AD conversion by the ADC 3. The offset value calculated as mentioned above is subtracted from the result of the AD conversion, and the result of the subtraction is multiplied by a ratio of the expected gain to the gain value calculated as mentioned above so as to cancel a gain error. Then, for ensuring continuity between data having different degrees of bit precision, the number of bits in data with the gain error canceled is increased by "n" bits in bit extension processing operation. For example, the condition "n=2" is to be specified for setting up a 4-fold expected gain in the PGA 5. The following describes details of exemplary operations in the bit-precision-variable AD conversion processing.

Figure 3:
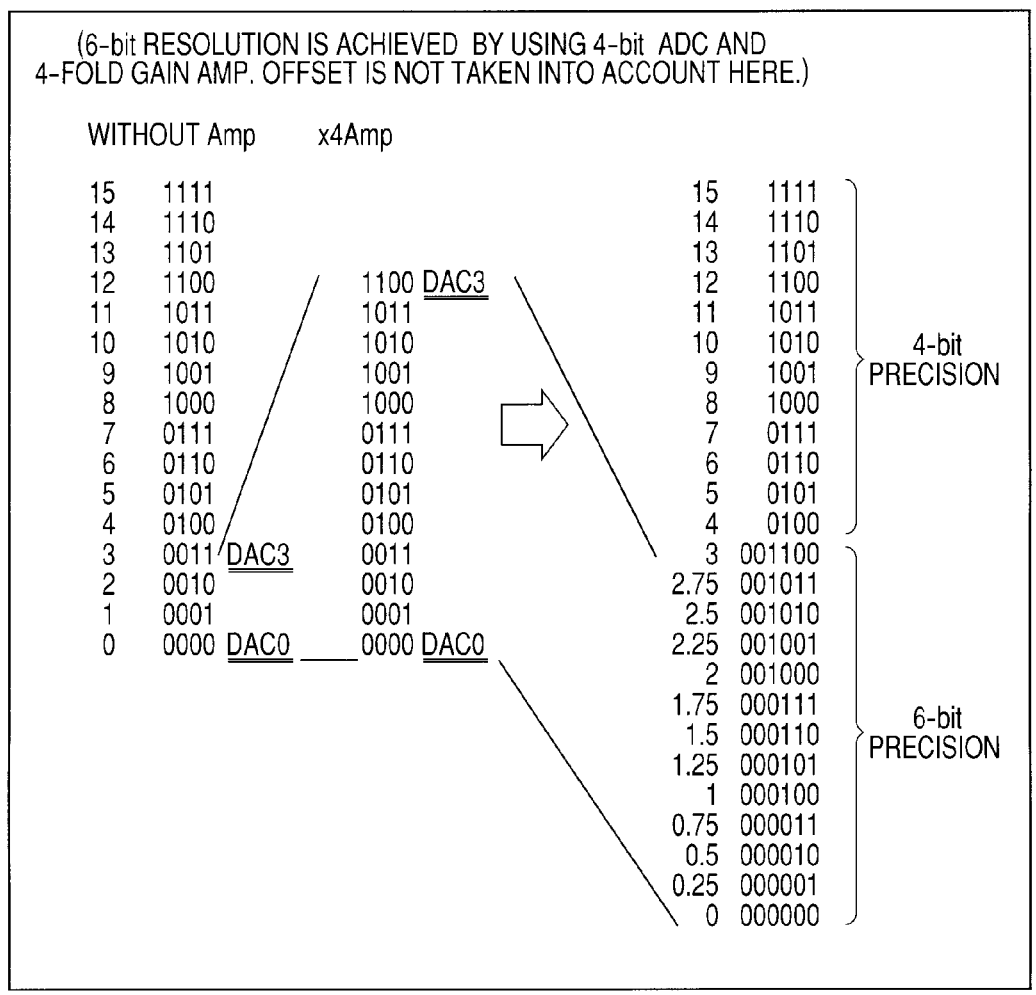
FIG. 3 is an explanatory diagram showing an example of bit-precision-variable AD conversion processing for achieving 6-bit resolution under the conditions that there are provided a 4-bit level of conversion precision in an ADC and a 4-fold expected gain in a PGA with offset not taken into account.

FIG. 3 shows a processing example for achieving 6-bit resolution under the conditions that there are provided a 4-bit level of conversion precision in the ADC 3 and a 4-fold expected gain in the PGA 5 with offset not taken into account. The term "Without Amp" in FIG. 3 signifies that no amplification is performed by the PGA 5, and the term "×4 Amp" signifies that a 4-fold gain is given as a measured gain of the PGA 5. In a case where a range including analog input signals DAC0 to DAC3 is subjected to amplification by the PGA 5, AD-converted output signals "0000" to "1100" are produced by the ADC 3 in response to the analog input signals DAC0 to DAC3. The AD-converted output signals thus obtained are taken as resultant data of conversion in 6-bit precision. To ensure data continuity in relation to AD conversion result with respect to an analog input larger than those to the DAC 3, the CPU carries out bit "0" extension calculation to add "0" at each of two bit positions on the highest-order position side by shifting AD-converted output data to the right by two bit positions. The result of the calculation is applied as AD conversion result with respect to the analog signal ALG1 within small-signal range limitation. In FIG. 3, the values indicated with "6-bit precision" represent AD conversion result data with respect to the analog signal ALG1 within small-signal range limitation, and the values indicated with "4-bit precision" represent AD conversion result data with respect to the analog signal ALG1 in excess of small-signal range limitation. As can be clarified from these values, data continuity is ensured between the result of AD conversion in 6-bit precision and the result of AD conversion in 4-bit precision.

In the example demonstrated in FIG. 3, the expected-to-measured gain ratio is "4/4=1". Hence, in gain error cancellation processing for the signal amplified by the PGA 5, the result of conversion by the ADC 3 is multiplied by "1" corresponding to the expected-to-measured gain ratio. That is, the result of the conversion remains unchanged even after execution of the gain error cancellation processing. In bit extension processing in which the number of bits in data with the gain error thereof canceled is increased by "n" bits as described above, since the range to be enhanced in bit precision has a reference point thereof at "0", two bit positions (n=2) are added on the highest-order position side of the error-canceled data by performing bit "0" extension operation in the same manner as mentioned above.

FIG. 4 shows a processing example for achieving 6-bit resolution under the conditions that there are provided a 4-bit level of conversion precision in the ADC 3 and a 4-fold expected gain in the PGA 5 with offset taken into account. The term "Without Amp" in FIG. 4 signifies that no amplification is performed by the PGA 5, and the term "×5 Amp+1 LSB" signifies that a 5-fold gain is given as a measured gain of the PGA 5 and that an offset corresponding to 1 LSB is provided. In this example, therefore, the expected-to-measured gain ratio is "4/5". In a case where a range including analog input signals DAC0 to DAC3 is subjected to amplification by the PGA 5, AD-converted output signals "0001" to "10000" are produced by the ADC 3 in response to the analog input signals DAC0 to DAC3 according to a combination of an offset and an error in the measured gain with respect to the expected gain. From the result of conversion (D), the offset is subtracted (D'1), and the result of this subtraction is multiplied by a ratio of the expected gain to the gain calculated (4/5) so as to cancel a gain error. The resultant data values with gain errors thereof canceled are represented as "0000" to "1100". Then, in the same manner as mentioned above, the CPU carries out bit "0" extension calculation to add "0" at each of two bit positions on the highest-order position side by shifting the error-canceled result to the right by two bit positions. The result of the calculation is applied as AD conversion result with respect to the analog signal ALG1 within small-signal range limitation. In FIG. 4, the values indicated with "6-bit precision" represent AD conversion result data with respect to the analog signal ALG1 within small-signal range limitation, and the values indicated with "4-bit precision" represent AD conversion result data with respect to the analog signal ALG1 in excess of small-signal range limitation. As can be clarified from these values, data continuity is ensured between the result of AD conversion in 6-bit precision and the result of AD conversion in 4-bit precision.

FIG. 5 shows a processing example in which a midpoint of a conversion range is used as a measurement reference point. In this example, 6-bit resolution is achieved under the conditions that there are provided a 4-bit level of conversion precision in the ADC 3 and a 4-fold expected gain in the PGA 5 with offset not taken into account. The term "Without Amp" in FIG. 5 signifies that no amplification is performed by the PGA 5, and the term "×4 Amp" signifies that a 4-fold gain is given as a measured gain of the PGA 5. Hence, it is conditioned that the measured-to-expected gain ratio is "4/4=1". In a case where "1000" (DAC0) in the result of conversion without amplification corresponds to the conversion range midpoint and where a range of analog input signals DAC0 to DAC2 and a range of analog input signals DAC0 to DACm2 are subjected to amplification by the PGA 5, AD-converted output signals "0000" to "1111" are produced by the ADC 3 in response to the analog input signals DACm2 to DAC2. It is assumed that neither gain error nor offset is contained in the output of amplification and conversion exemplified here. For the range to be enhanced in bit precision that has a reference point thereof at an intermediate range position of conversion, the CPU 2 carries out bit extension processing in the following manner: Data at the reference point is shifted left by "n"-bit positions. Then, a difference between the data at the reference point and the error-canceled data is added to the resultant data obtained by this left-shifting operation. More specifically, "1000" representing AD conversion data at the reference point is shifted left by two bit positions (n=2; 4-fold) to yield "100000". Assuming that data measured by the ADC 3 is "1011", a difference "0011" between the reference point data "1000" and the measured data "1011" is added to the 4-fold data "100000" to yield "100011". In FIG. 5, the values indicated with "6-bit precision" represent AD conversion result data with respect to the analog signal ALG1 within small-signal range limitation, and the values indicated with "4-bit precision" represent AD conversion result data with respect to the analog signal ALG1 in excess of small-signal range limitation. As can be clarified from these values, data continuity in the case of midpoint centering is also ensured between the result of AD conversion in 6-bit precision and the result of AD conversion in 4-bit precision.

Figure 6:
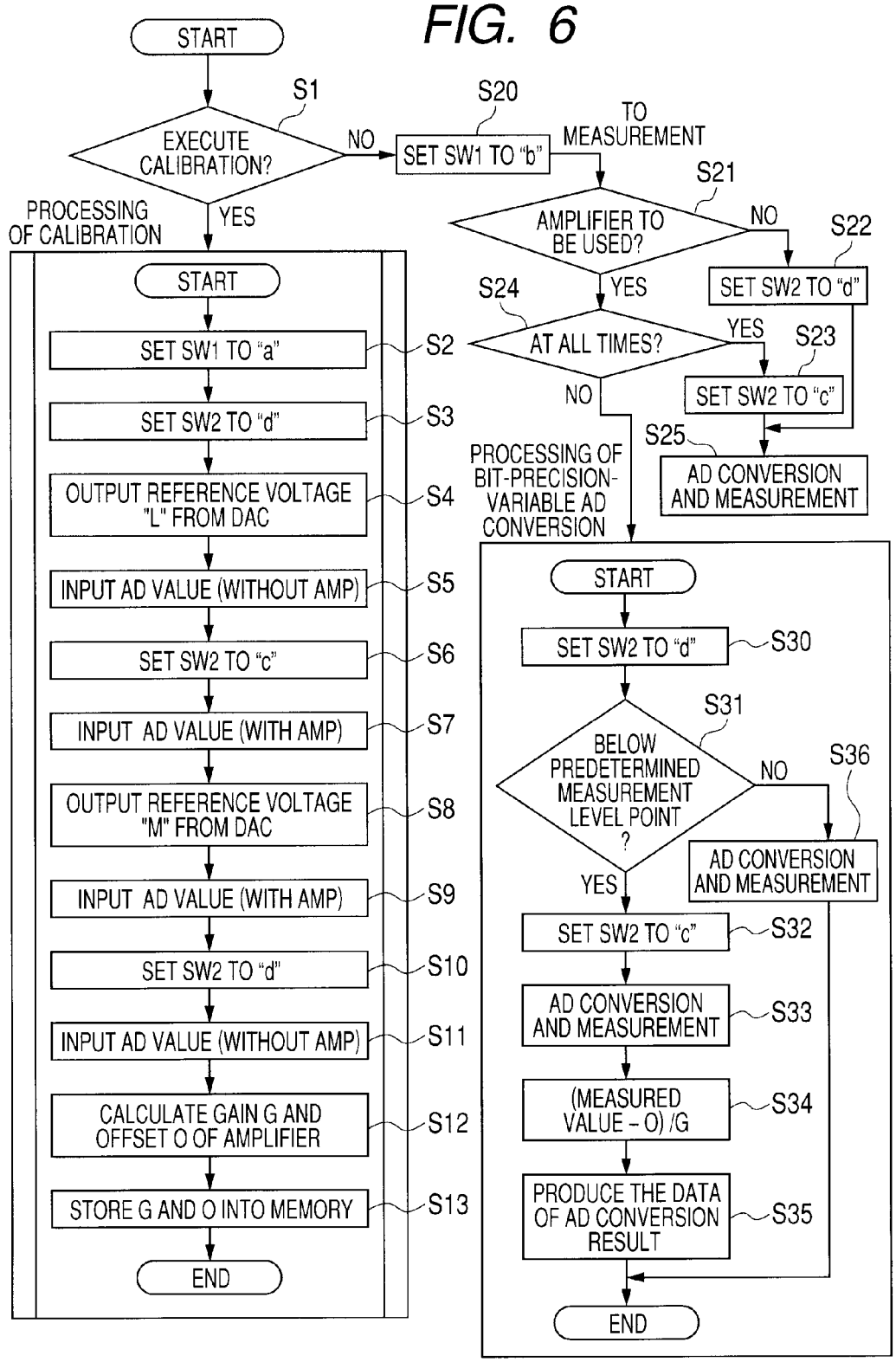
FIG. 6 is a flowchart illustrating an overall processing procedure of AD conversion operation to be conducted by the microcomputer.

FIG. 6 shows an overall processing procedural flow of the AD conversion operation mentioned above. At step S1, a judgment is made on whether or not to execute calibration processing. For example, at the time of power-on resetting or in the event of a timeout indicated by a particular timer, it is judged that calibration processing shall be put into execution.

In the calibration processing, the selector (SW1) 6 is set to an input selection state "a" (S2), the selector (SW2) 7 is set to an input selection state "d" (S3), and then a reference voltage "L" is output from the DAC 4 (S4). Thereupon, the CPU 2 receives the result of AD conversion by the ADC 3 (S5). Subsequently, the selector (SW2) 7 is set to an input selection state "c" (S6), and the CPU 2 receives the result of AD conversion by the ADC 3 through signal amplification by the PGA 5 with respect to the reference voltage "L" (S7). Then, a reference voltage "M" is output from the DAC 4 (S8), and the CPU 2 receives the result of AD conversion by the ADC 3 through signal amplification by the PGA 5 with respect to the reference voltage "M" (S9). Further, the selector (SW2) 7 is set to an input selection state "d" (S10), and the CPU 2 receives the result of AD conversion by the ADC 3 through direct input with respect to the reference voltage "M" (S11). Based on the data thus received, the CPU 2 calculates a gain value Gin of the PGA 5 and an offset value Ost thereof (S12), and then stores the resultant calculated data into the nonvolatile memory 9.

If step S1 determines that no calibration processing shall be put into execution, the selector (SW1) 6 is set to an input selection state "b" (S20). Then, a judgment is made on whether or not to use the PGA 5 (S21). If it is judged that the PGA 5 is not to be used, the selector (SW2) 7 is set to the input selection state "d" (S22) to perform AD conversion using the ADC 3 (S25).

If step S21 determines that the PGA 5 shall be used, a judgment is then made on whether or not to use the PGA 5 at all times (S24). If it is judged that the PGA 5 shall not be used at all times, the bit-precision-variable AD conversion processing is put into execution.

In execution of the bit-precision-variable AD conversion processing, the selector (SW2) 7 is set to the input selection state "d" (S30), and a judgment is made on whether or not the measurement level is below a predetermined point (S31). For example, this judgment is made by the CPU 2 according to a mode signal or register setting value for the measurement range concerned with respect to the full range. If the measurement level is below the predetermined point, i.e., if measurement is to be performed for a small signal input within a predetermined range, the selector (SW2) 7 is set to the input selection state "c" (S32), and the ADC 3 performs AD conversion and measurement of an amplified signal output from the PGA 5 (S33). On the result of the measurement, a gain error is canceled as aforementioned (S34). That is, a calculation represented by the expression "(Measured value−Ost)× Gexp/Gin" is performed, where Gin indicates a measured gain, and Gexp indicates an expected gain. For the result of the calculation, "n"-bit extension is made as aforementioned to produce AD conversion result data (S35).

If step S31 determines that the measurement level is not below the predetermined point, AD conversion operation is performed by the ADC 3 (S36). If it is judged, at step 24, that the PGA 5 shall be used at all times for AD conversion, the selector (SW2) 7 is set to the input selection state "c" (S23). Then, AD conversion operation is performed by the ADC 3 (S25). Regarding offset cancellation in AD conversion operation at step 36, no particular detailed description is given herein. As an alternative means, there may be provided such an arrangement that a measured offset value Ost is subtracted in calculation to produce the result of AD conversion, for example.

According to the present preferred embodiment described above, data continuity can be ensured in bit-precision-variable AD conversion processing regardless of whether or not amplified signals are applied to AD conversion operation.

Since a gain and offset of the PGA 5 are calibrated in effect through calculations by the CPU 2, it is not required to provide an extremely high degree of precision in the PGA 5 itself.

Since calibration is made using the ADC 3 and DAC 4 that are formed over the same semiconductor chip, it is possible to carry out consistent measurement operation with high precision not affected by variations in operating voltage or ambient temperature.

Data continuity can be ensured between conversion result data having different degrees of bit precision not only in the case that the measurement range has a reference point thereof at "0" as described in relation to FIGS. 3 and 4 but also in the case that the range has a reference point thereof at an intermediate range position as described in relation to FIG. 6. The present preferred embodiment is therefore suitable for AD conversion operation of small signals in such an application as servo control.

<Second Preferred Embodiment of AD Conversion System>

In the first preferred embodiment described above, calibration processing is performed with the programmable gain amplifier (PGA) 5, and the gain of the PGA 5 is set to "1" at the time of offset measurement or to "a desired target gain value" at the time of actual-measurement gain acquisition. In execution of AD conversion processing with a high degree of bit precision, the offset concerned is subtracted from the result of AD conversion with respect to an amplified signal output from the PGA 5, and the result of the subtraction thus performed is multiplied by a ratio (r=Ge/Gm) of expected gain (Ge) to measured gain (Gm) so as to cancel a gain error. Then, based on the result of the gain error cancellation, bit-shifting in accordance with the gain factor concerned is performed to increase the degree of bit precision.

Through comparison with the first preferred embodiment, the following describes a second preferred embodiment of an AD conversion system using an amplifier with a constant gain.

Figure 7:
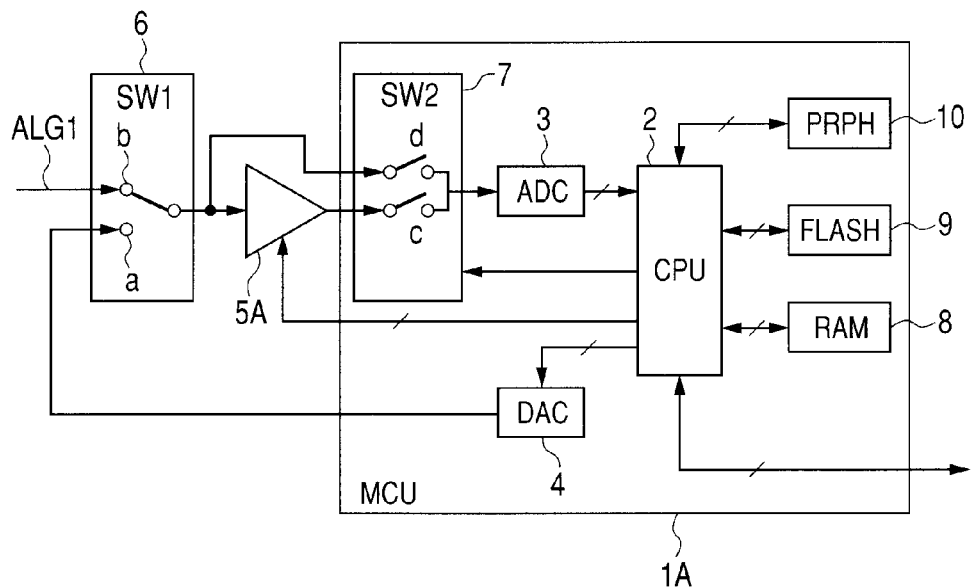
FIG. 7 is a block diagram showing a second preferred embodiment of an AD conversion system according to the present invention.

FIG. 7 shows the second preferred embodiment of the AD conversion system according to the present invention. Firstly, being different from the arrangement shown in FIG. 1, a microcomputer 1A comprises a selector 7, an AD converter circuit 3, a CPU 2, a PRPH 10, an FLASH 9, a RAM 8, and a DAC 4 without including an amplifier circuit 5A and a selector 6. That is, the amplifier circuit 5A and the selector 6 are provided as external circuits for the microcomputer 1A. Secondly, for example, the gain of the amplifier circuit 5A is fixedly set to an 8-fold level, though not particularly limited thereto. Accordingly, a technique of calculation somewhat different from that of the first preferred embodiment is used to cope with conditional differences in measured offset and gain error parameters. In the following, like reference characters are used to designate like or corresponding component elements having the same functions as those described above with reference to FIG. 1 for the sake of avoiding repetitive detailed description thereof. The selector 7 shown in FIG. 7 is arranged as a selector on an AD conversion channel for an analog input port, for example.

Figure 8:
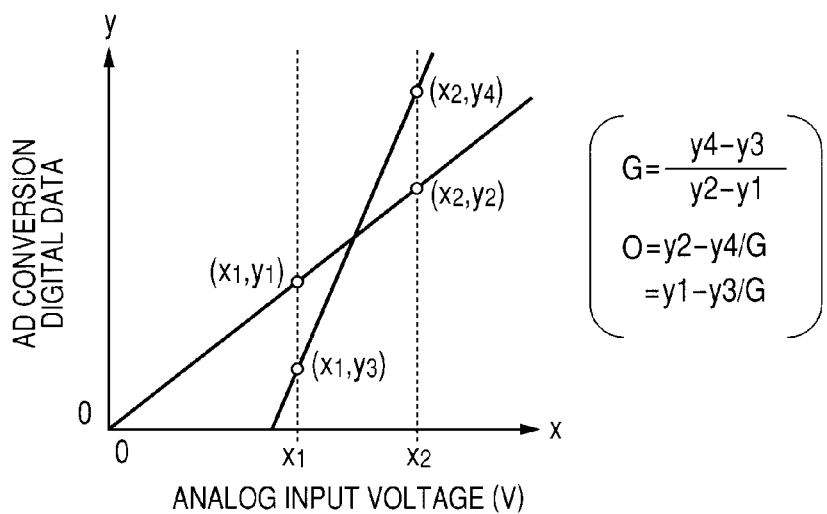
FIG. 8 is an explanatory diagram showing a technique for calculating a gain value G and an offset value O through calibration processing in the second preferred embodiment.

FIG. 8 illustrates calibration processing in the second preferred embodiment of the present invention. With respect to analog signal voltages x1 and x2 output from the DA converter circuit 4, AD conversion data values y1 and y2 in the AD converter circuit 3 are determined for AD conversion operation using a path without the amplifier circuit 5A (in a case where path "d" is selected by the selector 7). Then, AD conversion data values y3 and y4 in the AD converter circuit 3 are determined for AD conversion operation using a path with the amplifier circuit 5A (in a case where path "c" is selected by the selector 7). Thus, a gain value G can be calculated according to the expression "G=(y4−y3)/(y2−y1)", and an offset value O can be calculated according to the expression "O=y2−y4/G" or "O=y−y3/G". Based on the gain value G and offset value O thus obtained, the calculation "z=Z/G−O" is performed with respect to AD conversion data "Z" measured through the path with the amplifier circuit 5A. Thus, data "z" subjected to cancellation of a gain error in the amplifier circuit 5A and enhancement in bit precision is applicable as data having reliable continuity with AD conversion data obtained through the path without the amplifier circuit 5A.

Figure 9:
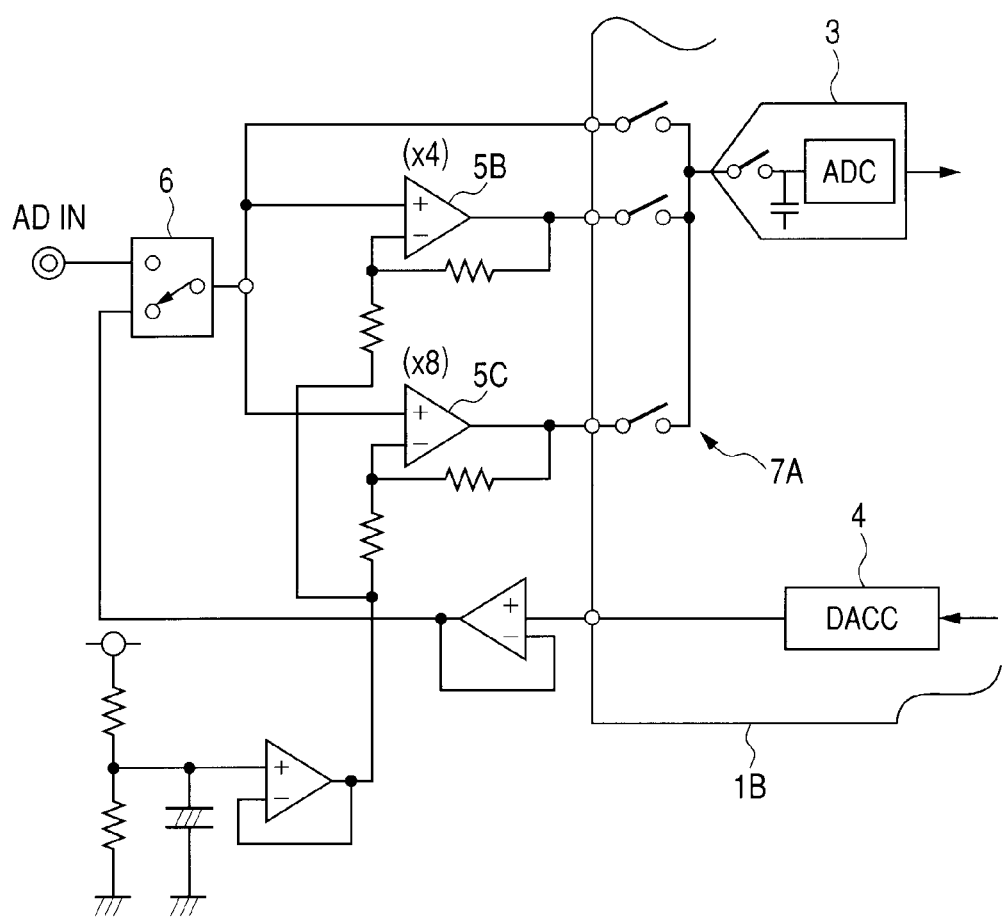
FIG. 9 is a block diagram showing an exemplary arrangement of a plurality of amplifier circuits in the second preferred embodiment.

FIG. 9 shows an exemplary arrangement of a plurality of amplifier circuits 5B and 5C in the second preferred embodiment of the present invention. Though not particularly limited to the following conditions, for example, the amplifier circuit 5B has a 4-fold expected gain, the amplifier circuit 5C has an 8-fold expected gain, and the selector 7A is used for selecting a path without amplification, a path with amplification by the amplifier circuit 5B, or a path with amplification by the amplifier circuit 5C. Under the control of the microcomputer 1B, the path with amplification by the amplifier circuit 5C is selected at the time of input of a minuscule signal, the path with amplification by the amplifier circuit 5B is selected at the time of input of a small signal, or the path without amplification is selected at the time of input of an ordinal signal. The selector 7A shown in FIG. 9 is arranged as a selector on an AD conversion channel for analog input port, for example.

<Third Preferred Embodiment of AD Conversion System>

In the above-described first and second preferred embodiments of the present invention, it is assumed that a changeover of AD conversion operation is made after preparatively determining whether AD conversion operation using a path without amplification or AD conversion operation using a path with amplification is to be put into execution. For example, at step S21 indicated in FIG. 6, a judgment is made on whether to not to use the path with amplification by the amplifier circuit. According to a third preferred embodiment of the present invention, a judgment is made on whether or not the result of AD conversion operation using a path without amplification is out of a predetermined range, and then a selection is made control-wise between AD conversion operation using a path with amplification and AD conversion operation using a path without amplification. Described below is a control scheme (multi-sampling control scheme) according to the third preferred embodiment according to the present invention.

Figure 10:
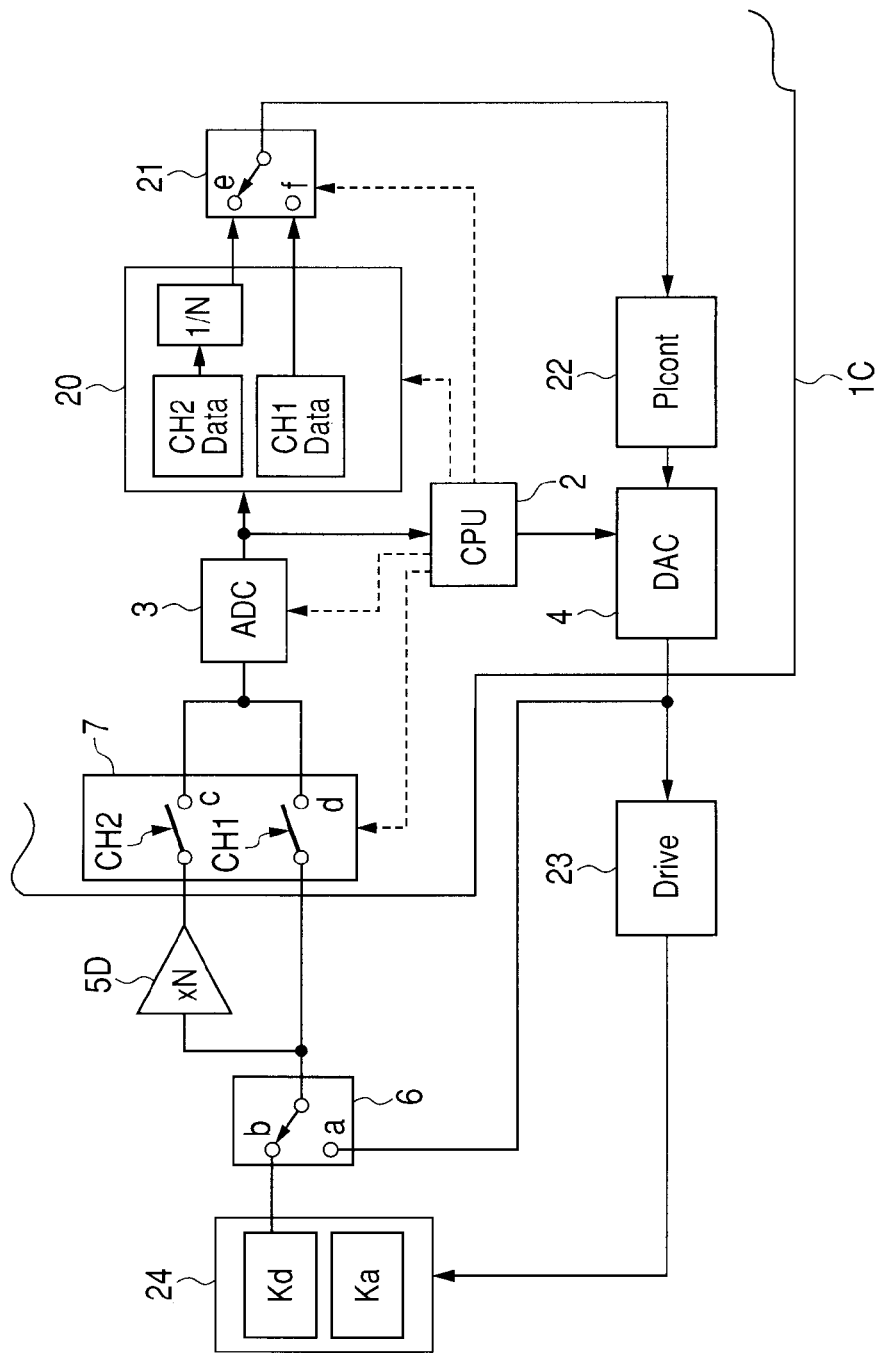
FIG. 10 is a block diagram showing a third preferred embodiment of an AD conversion system applied to a servo control system according to the present invention.

FIG. 10 shows the third preferred embodiment of the AD conversion system applied to a servo control system according to the present invention. For example, in the third preferred embodiment, an actuator 24 is operated in accordance with control parameters Ka and Kd signaled from a driver 23. In a case where the actuator 24 is arranged as a digital power supply circuit, the actuator 24 outputs a voltage produced in accordance with the control parameters Ka and Kd. While monitoring the voltage output from the actuator 24, a microcomputer 1C controls the driver 23 so that the voltage being monitored will meet a predetermined target value.

A selector 6 and an amplifier circuit 5D are provided as external circuits for the microcomputer 1C. The amplifier circuit 5D is arranged to have an "N"-fold gain. The microcomputer 1C comprises a selector 7 for analog input port provision, an AD converter circuit 3, a DA converter circuit 4, a CPU 2, an arithmetic circuit 20 for calculating AD conversion data obtained from the servo control system, a selector 21, and a PI control circuit (PIcont) 22.

In the selector 7, an input port "d" thereof is used for AD conversion channel CH1, and an input "c" thereof is used for AD conversion channel CH2. Calibration processing is put into execution under the control of CPU 2 in the same manner as mentioned in the foregoing. For example, a gain value G and an offset value O are calculated preparatively as described with reference to FIG. 8. In AD conversion operation under the control of the CPU 2, the AD conversion channel CH1 is selected, and the result of AD conversion by the AD converter circuit 3 is input. Then, a judgment is made on whether of not the result of the AD conversion is within a predetermined range. If the result of the AD conversion is within the predetermined range, the arithmetic circuit 20 temporarily retains AD conversion data (CH1 Data) corresponding to data input through the AD conversion channel CH1. Via a terminal "f" of the selector 21, the AD conversion result data is output to the PI control circuit 22. Alternatively, if the result of the AD conversion is out of the predetermined range, data input through the AD conversion channel CH2 is fed to the AD converter circuit 3 under the control of the CPU 2. Then, based on AD conversion data (CH2 Data), the arithmetic circuit 20 carries out error cancellation calculation using the gain value G and offset value O mentioned above. Thus, error-canceled AD conversion data is obtained. Further, on the error-canceled AD conversion data, "1/N" calculation processing is performed, and AD conversion result data obtained through the subtraction concerned is output to the PI control circuit 22 via a terminal "e" of the selector 21.

The PI control circuit 22, which is designed to perform proportion-integration (PI) control, detects an error in control input with respect to a target value, and feeds the detected error to the DA converter circuit 4 and the CPU 2. On receipt of the detected error, the DA converter circuit 4 applies an analog value corresponding to the detected error to the driver 23 for control parameter regulation. Thus, an output voltage of the actuator 24 is controlled according to the control parameter regulation.

In the third preferred embodiment, a judgment is made on whether or not the result of AD conversion operation on a path without amplification is out of a predetermined range, and then a selection is made control-wise between AD conversion operation using a path with amplification and AD conversion operation using a path without amplification. Hence, in comparison with such a system arrangement that a changeover of AD conversion operation is made after preparatively determining whether AD conversion operation using a path without amplification or AD conversion operation using a path with amplification is to be put into execution, the third preferred embodiment is more advantageous in that servo control with high responsivity can be achieved easily.

Figure 11:
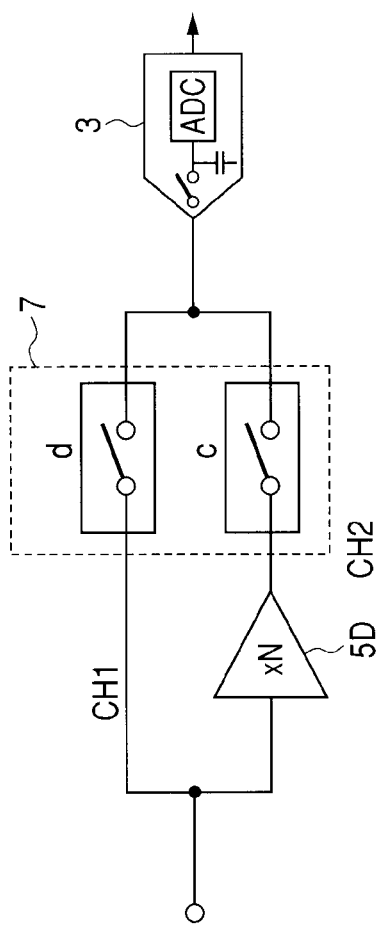
FIG. 11 is a partial block diagram showing a path arrangement of AD conversion channels in the AD conversion system illustrated in FIG. 10.

FIG. 11 shows a partial block diagram of a path arrangement of AD conversion channels CH1 and CH2 in the AD conversion system illustrated in FIG. 10.

Figure 12:
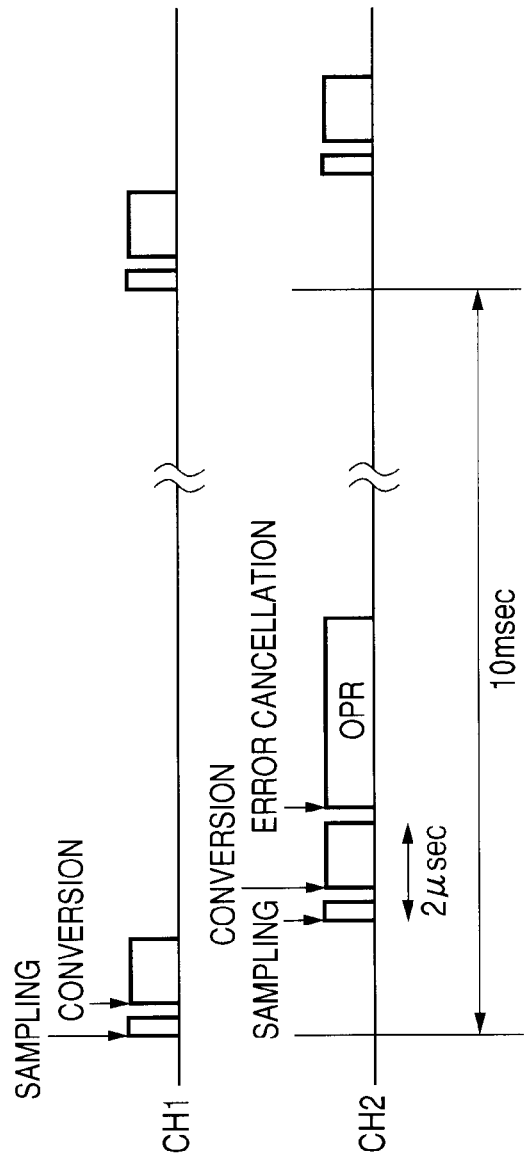
FIG. 12 is a timing chart of alternate-sampling AD conversion operation in the AD conversion system illustrated in FIG. 10.

FIG. 12 shows a timing chart of exemplary alternate-sampling AD conversion operation in the AD conversion system illustrated in FIG. 10. This example is based on the assumption that operational control is to be performed in the case of long-cycle conversion which can be regarded as being substantially equivalent to simultaneous sampling, e.g., in the case of low-speed input signals. More specifically, it is assumed that a time period of 2 μsec is taken for sampling and conversion in a cycle of 10 msec. In this cycle, there is a sufficient period for calculation processing that is to be performed for such a purpose as error cancellation using a gain value G and an offset value O described with reference to FIG. 8. During "OPR" indicated in FIG. 12, the calculation processing for error cancellation is to be performed.

FIG. 13 shows a flowchart of a processing procedure for carrying out the alternate-sampling AD conversion operation exemplified in FIG. 12. In principle, calibration processing is performed in a manner similar to that shown in FIG. 6. At step S12A in the alternate-sampling AD conversion operation, a gain value G and an offset value O of the amplifier circuit are calculated by using a calculation technique different from that described with reference to FIG. 8. In execution of the alternate-sampling AD conversion processing, a terminal "b" of the selector 6 is selected (S20), and a terminal "d" of the selector 7 (AD conversion channel CH1) is selected (S40) for performing measurement. Then, using the AD converter circuit 3, measurement is carried out (S41). In case that the result of conversion is within a predetermined range, a judgment is made on whether or not the measurement level concerned is below a predetermined point (S42). If the measurement level is not below the predetermined point, the measurement data currently obtained (CH1 Data) is used as the AD conversion result (S46). If the measurement level is below the predetermined point, a terminal "c" of the selector 7 (AD conversion channel CH2) is selected, and measurement is carried out using the AD converter circuit 3 (S44). Then, on the resultant measured value data, a calculation represented by the expression "Measured value/G−O" is made in a manner similar to that described with reference to FIG. 8 (S45), for example. Thus, a gain error and an offset value are canceled with respect to the measured value data. Then, on the resultant error-canceled data (CH2 Data), "1/N" calculation processing is performed to produce AD conversion result data (S46).

According to the above-mentioned AD conversion processing based on the multi-sampling control scheme, the following advantageous features can be provided.

(1) Since AD conversion processing in a wide range (on AD conversion channel CH1 corresponding to a path without amplification) is put into execution at all times, the CPU 2 is allowed to readily make a preparative judgment on whether data on a path with amplification (CH2) or data on a path without amplification (CH1) is to be used. That is, it is just required for the CPU 2 to check whether or not the AD conversion value concerned is within a predetermined range. Contrastingly, in such an arrangement as the aforementioned first preferred embodiment wherein a changeover of AD conversion operation is made after preparatively determining whether AD conversion operation using a path without amplification or AD conversion operation using a path with amplification is to be put into execution, it is necessary to make a changeover to the path without amplification if a predetermined range is exceeded on the path with amplification or a changeover to the path with amplification if another range is met on the path without amplification. In the first or second preferred embodiment, since measurement is performed through accomplishment of a path changeover after making a judgment regarding the predetermined range as mentioned above, it is predictable that a measurement operation will take a longer time than that required in the third preferred embodiment based on the multi-sampling control scheme.

(2) Since error cancellation is performed using a gain value G and an offset value O described with reference to FIG. 8, resultant high-order-bit data of calculation on the path with amplification is consistent with value data obtained on the path without amplification. Thus, data continuity can be ensured as in the first and second preferred embodiments described in the foregoing.

(3) In an application to a servo control system, it is possible to provide desirable responsivity in servo control.

(4) Moreover, by using data obtained from the path without amplification, it is possible to further shorten a calculation time required for error cancellation regarding AD conversion data on the path with amplification. More specifically, as can be understood from the description given with reference to FIG. 8, there is a relational condition represented by the expression "y2=y4/G–O". Hence, between 12-bit final conversion value data D12 determined through calculation of data DA12 obtained on the path with amplification (CH2) with respect to newly obtained data D and data D10 obtained on the path without amplification (D12−D10=d, where "d" indicates the two low-order bits of 12-bit data), the following relational condition is provided; "D10+d=DA12/G–O", i.e., "d=DA12/G–O–D10". In general terms, a longer processing time is required for performing an arithmetic division involving values having a larger number of digits. Therefore, "Gd=DA12−OG−GD10" is calculated to determine a small gain-factor value Gd corresponding to the two low-order bits of 12-bit data. Then, the value Gd thus determined is divided by "G" to determine "d", and D10 is added to the resultant value "d". In this fashion, high-speed calculation can be performed reliably on data having continuity since a processing time required for arithmetic multiplication is commonly shorter than that required for arithmetic division.

<Fourth Preferred Embodiment of AD Conversion System>

The following describes another exemplary form of a multi-sampling control scheme. While alternate-sampling AD conversion operation is employed in the third preferred embodiment described above, simultaneous-sampling AD conversion operation is employed in a fourth preferred embodiment of an AD conversion system demonstrated below.

Figure 14:
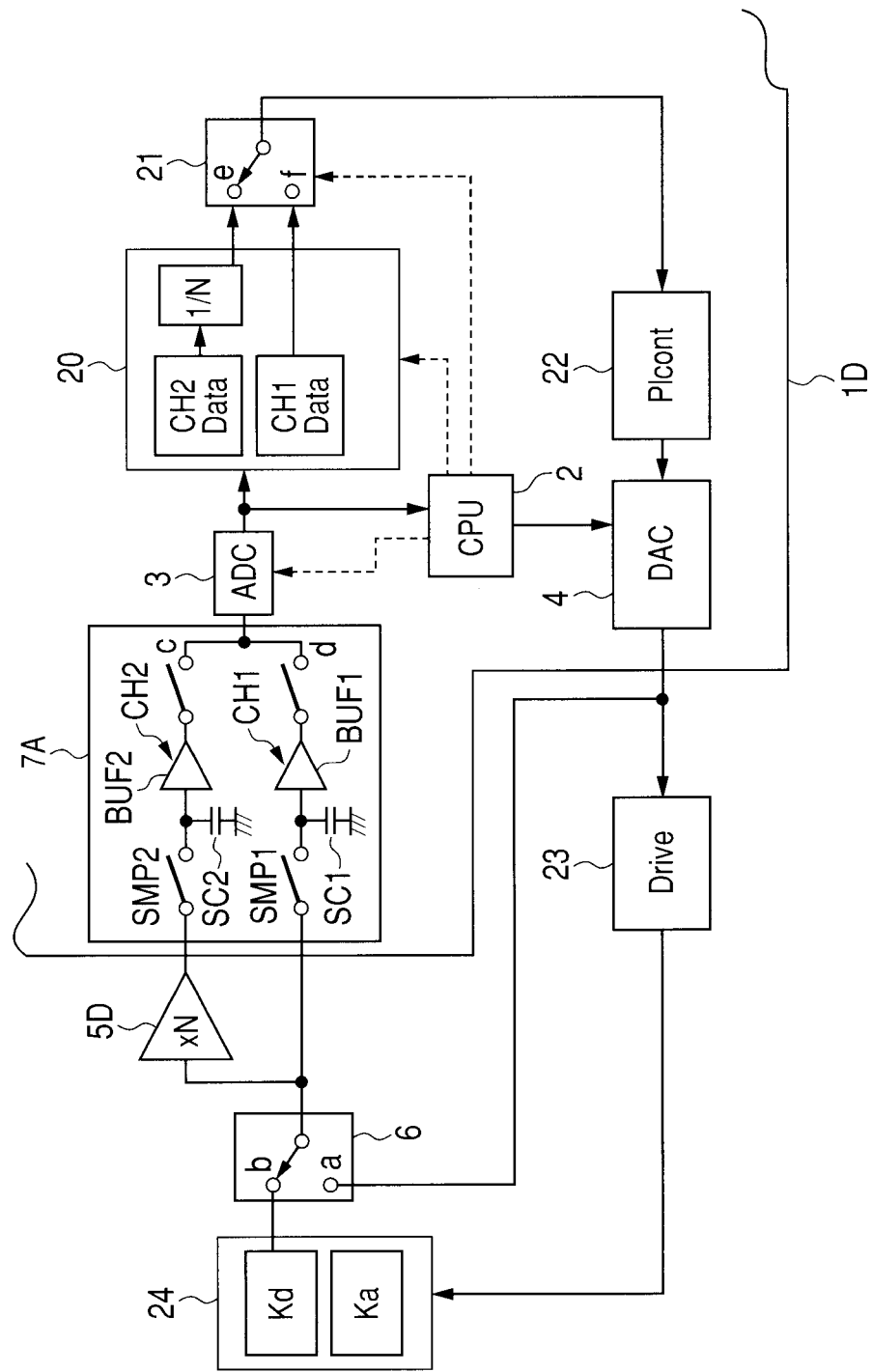
FIG. 14 is a block diagram showing a fourth preferred embodiment of an AD conversion system applied to a servo control system according to the present invention.

FIG. 14 shows the fourth preferred embodiment of the AD conversion system applied to a servo control system according to the present invention. In the fourth preferred embodiment, being different from the arrangement shown in FIG. 10, there is provided a microcomputer 1D comprising a selector 7A that has a unique arrangement serving as an analog input port. As illustrated in FIG. 10, a sample-and-hold circuit is additionally provided for the purpose of enabling simultaneous-sampling on AD conversion channels CH1 and CH2. More specifically, on the AD conversion channel CH1, there are provided a sampling switch SMP 1, a sampling capacitor SC 1, and a buffer (voltage-follower amplifier) BUF 1. On the AD conversion channel CH2, there are provided a sampling switch SMP 2, a sampling capacitor SC 2, and a buffer (voltage-follower amplifier) BUF 2. During a period of sampling operation, a CPU 2 turns on both the sampling switches SMP 1 and SMP 2, thereby allowing necessary electric charge to be held in the capacitors SC 1 and SC 2. Since the remaining configurational features are similar to those shown in FIG. 10, no repetitive detailed description thereof is not given here.

Figure 15:
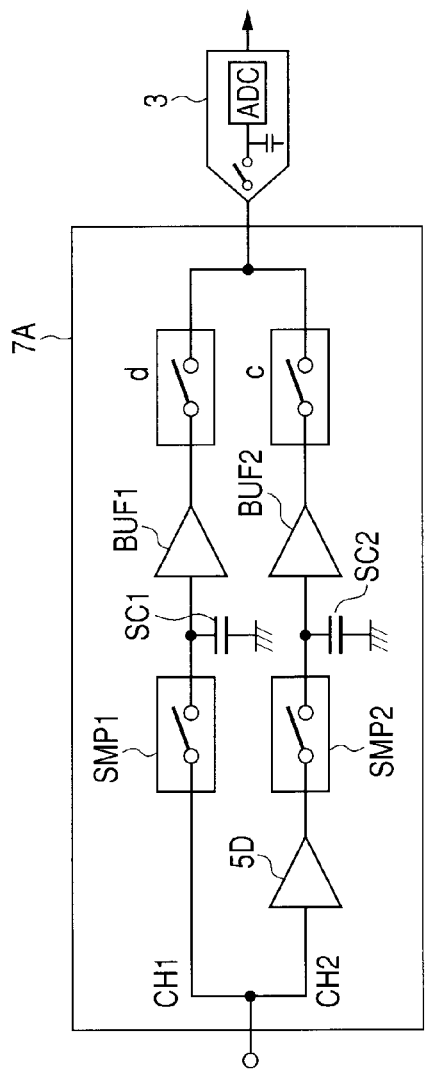
FIG. 15 is a partial block diagram showing a path arrangement of AD conversion channels CH1 and CH2 in the AD conversion system illustrated in FIG. 14.

FIG. 15 shows a partial block diagram of a path arrangement of AD conversion channels CH1 and CH2 in the AD conversion system illustrated in FIG. 14.

Figure 16:
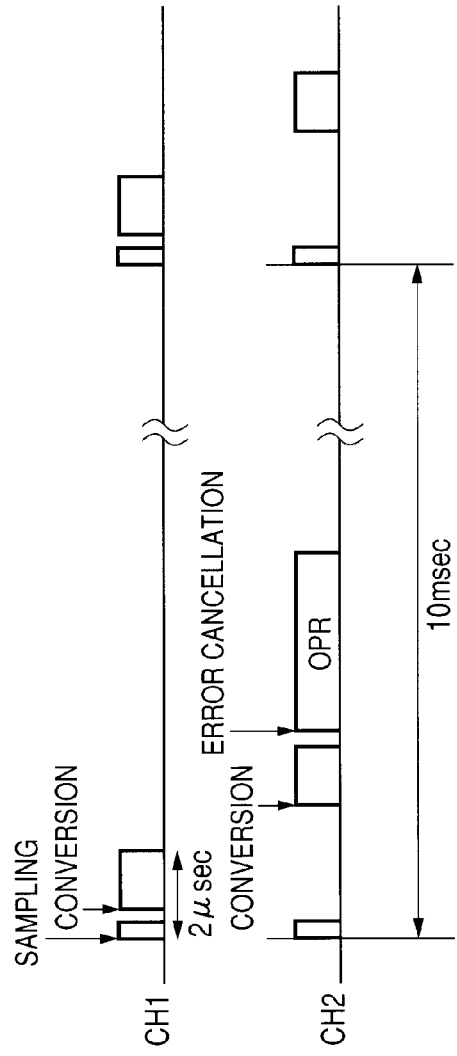
FIG. 16 is a timing chart of simultaneous-sampling AD conversion operation in the AD conversion system illustrated in FIG. 15.

FIG. 16 shows a timing chart of exemplary simultaneous-sampling AD conversion operation in the AD conversion system illustrated in FIG. 14. This example is based on the assumption that operational control is to be performed for low-speed input signals in a case where a time period of 2 μsec is taken for sampling and conversion in a cycle of 10 msec. In this cycle, there is a sufficient period for calculation processing that is to be performed for such a purpose as error cancellation using a gain value G and an offset value O described with reference to FIG. 8. During "OPR" indicated in FIG. 16, the calculation processing for error cancellation is to be performed.

FIG. 17 shows a flowchart of a processing procedure for carrying out the simultaneous-sampling AD conversion operation exemplified in FIG. 16. In principle, calibration processing is performed in a manner similar to that shown in FIG. 6. At step S12A in the simultaneous-sampling AD conversion operation, a gain value G and an offset value O of the amplifier circuit are calculated by using a calculation technique different from that described with reference to FIG. 8. In execution of the simultaneous-sampling AD conversion processing, a terminal "b" of a selector 6 is selected (S20), and then simultaneous sampling is performed on both the AD conversion channels CH1 and CH2 by using the sampling switches SMP 1 and SMP 2 (S51). Thereafter, a terminal "d" of the selector 7A (AD conversion channel CH1) is selected to execute AD conversion (S52). In case that the result of the AD conversion is within a predetermined range, a judgment is made on whether or not the measurement level concerned is below a predetermined point (S53). If the measurement level is not below the predetermined point, the measurement data currently obtained (CH1 Data) is taken as the AD conversion result (S57). If the predetermined level is below the predetermined point, a terminal "c" of the selector 7A (AD conversion channel CH2) is selected to execute AD conversion by using an AD converter circuit 3 (S55). Then, on the resultant conversion value data (CH2 Data), a calculation represented by "Measured value/G–O" is made in a manner similar to that described with reference to FIG. 8 (S56), for example. Thus, a gain error and an offset value are canceled with respect to the measured value data concerned. Then, on the resultant error-canceled data, "1/N" calculation processing is performed to produce AD conversion result data (S57).

According to the above-mentioned fourth preferred embodiment in which the simultaneous-sampling AD conversion operation is employed, advantageous features similar to those in the third preferred embodiment can be provided. In particular, the fourth preferred embodiment is applicable with ease in a situation where multi-sampling is performed for high-speed input signals having short cycles.

<Fifth Preferred Embodiment of AD Conversion System>

Figure 18:
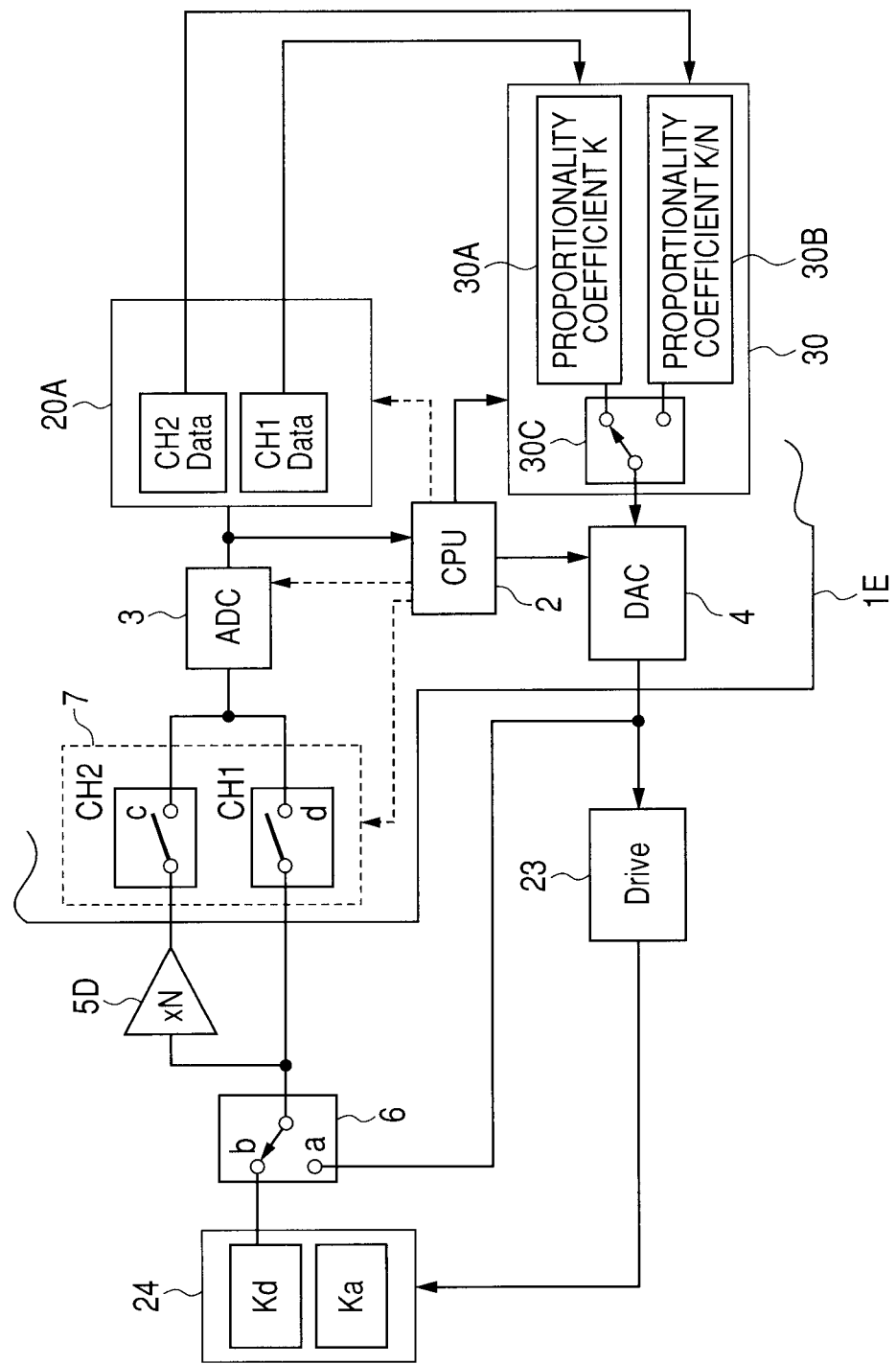
FIG. 18 is a block diagram showing a fifth preferred embodiment having a modified arrangement of the third preferred embodiment of the AD conversion system applicable to the servo control system exemplified in FIG. 10.

FIG. 18 shows a block diagram of a fifth preferred embodiment having a modified arrangement of the third preferred embodiment applicable to the servo control system exemplified in FIG. 10. For example, it is assumed that the PI control circuit 22 indicated in FIG. 10 performs arithmetic multiplications in proportion or ratio calculation processing. Further, in an electronic measurement system wherein measured values are converted for representation in weight, for example, multiplications are performed on measured values at a subsequent stage of data processing (not illustrated). In the system exemplified in FIG. 10, "1/N" division is performed by the arithmetic circuit 20, and multiplication is performed by the PI control circuit 22 disposed at a subsequent stage with respect to the arithmetic circuit 20. In this case, there may be provided such a modified arrangement that the subsequent-stage circuit has a multiplier coefficient reduced according to a gain value "N" in the amplifier circuit 5D. Thus, the necessity for the arithmetic circuit 20 to perform "1/N" division can be eliminated, thereby making it possible to shorten a total calculation processing time correspondingly. In the fifth preferred embodiment shown in FIG. 18, "Measured value/G–O" calculation is performed on AD conversion data measured through an AD conversion channel CH2, whereas "1/N" division is not performed on data with gain error and offset canceled (CH2 Data). More specifically, there is provided a proportional control circuit 30 which corresponds to the subsequent-stage PI control circuit in FIG. 10. The proportional control circuit 30 comprises a multiplication circuit 30A for performing multiplication by a proportionality coefficient "K" and a multiplication circuit 30B for performing multiplication by a proportionality coefficient "K/N". An output from the multiplication circuit 30A or the multiplication circuit 30B is selected by a selector 30C for allowing data to be fed to a DA converter circuit 4. When using result data of AD conversion obtained from the AC conversion channel CH2, a CPU 2 controls the selector 30C to select an output from the multiplication circuit 30B.

<Sixth Preferred Embodiment of AD Conversion System>

In the AD conversion system according to each of the preferred embodiments that have been described so far, a gain and offset of the amplifier circuit having an amplification factor larger than 1 are calibrated to ensure continuity of AD conversion data between data having different degrees of bit precision. Through modification of the AD conversion system according to the foregoing preferred embodiments, there may be provided such an arrangement that an amplifier circuit having an amplification factor smaller than 1, i.e., an attenuator, is used in lieu of the amplifier circuit having an amplification factor larger than 1. The following describes an AD conversion system having an attenuator according to a sixth preferred embodiment of the present invention.

Figure 19:
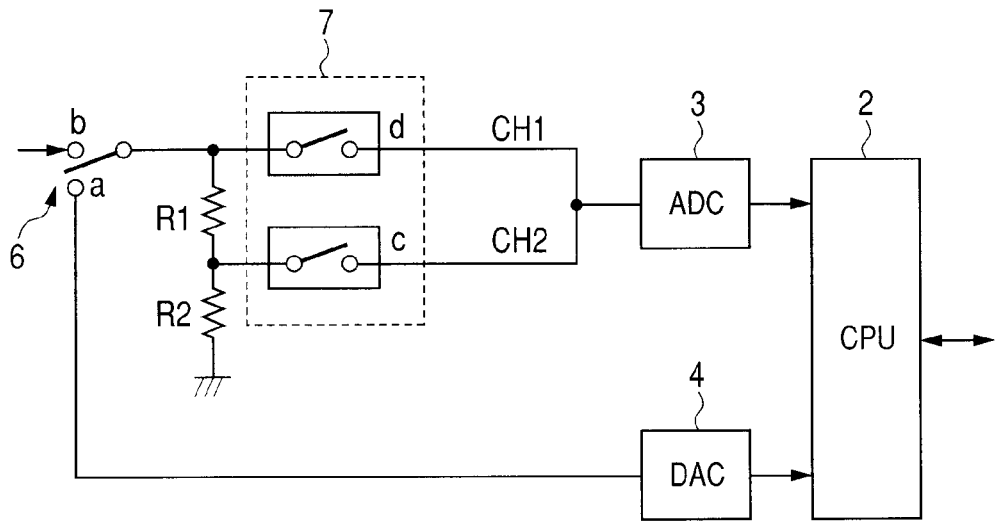
FIG. 19 is a block diagram showing a sixth preferred embodiment of an AD conversion system having an attenuator on an AD conversion channel thereof for providing applicability to such a purpose as voltmeter range changeover.

For example, as illustrated in FIG. 19, an arrangement applicable to such a purpose as voltmeter range changeover may be provided. Unlike a conventional AD conversion system wherein voltage division is performed by means of a precision resistor, the AD conversion system according to the sixth preferred embodiment is arranged as described below: With coarse voltage division made by resistors R1 and R2, an AD converter circuit performs AD conversion on a voltage-divided path and a voltage-undivided path for an output voltage from a DA converter. Then, based on the result of the AD conversion, a calibrated attenuation ratio is obtained in a manner similar to that described in the foregoing. By using the calibrated attenuation ratio thus obtained with respect to measured value data on a path subjected to attenuation, it is possible to easily ensure data continuity at the time of range changeover. Since no offset voltage is produced unlike the case of amplification, attenuation ratio calibration can be performed with ease.

Figure 20:
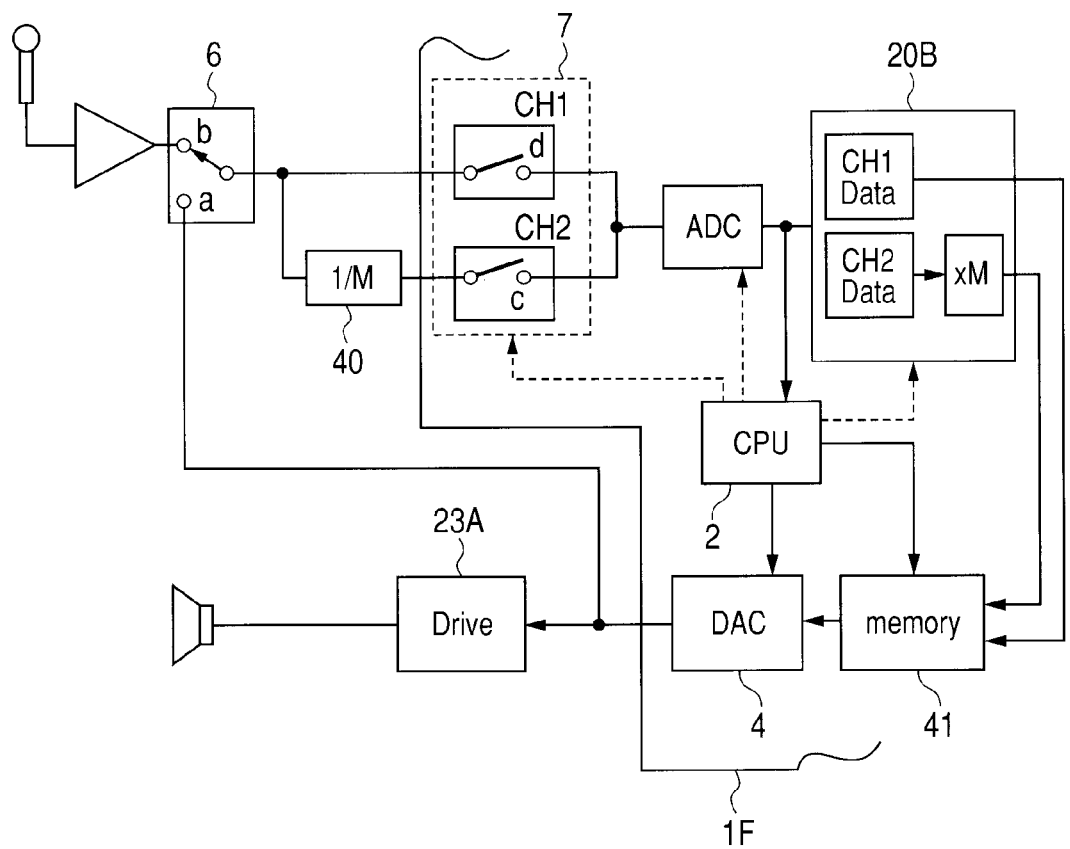
FIG. 20 is a block diagram showing an additional preferred embodiment of an AD conversion system having an attenuator on an AD conversion channel thereof for providing applicability to digital limiter operation.

As an additional preferred embodiment according to the present invention, FIG. 20 illustrates an AD conversion system applicable to digital limiter operation in a voice recorder or the like. In the voice recorder, it is of critical importance to prevent possible clipping of audio input signals. With an analog automatic gain control (AGC) circuit, complete prevention of the occurrence of a delay in response is difficult in practical applications. As shown in FIG. 20, there may be provided a circuit configuration including an attenuator 40 (attenuation ratio=1/M). For example, under the condition that a signal of approximately −12 dB (1/4), though not particularly limited thereto, is acquired at all times, data corresponding to four times the approximately −12 dB signal ("M" times) is used substitutively on occurrence of a clipping. Thus, data continuity can be ensured to allow audio signal recording free from clipping. Although two-bit extension is made in data in this case, any rearrangement thereof is allowed through subsequent processing. It is not necessary to rearrange two-bit-extended data in a situation where a DA converter circuit 4 is designed to comply with the number of bits concerned.

Figure 21:
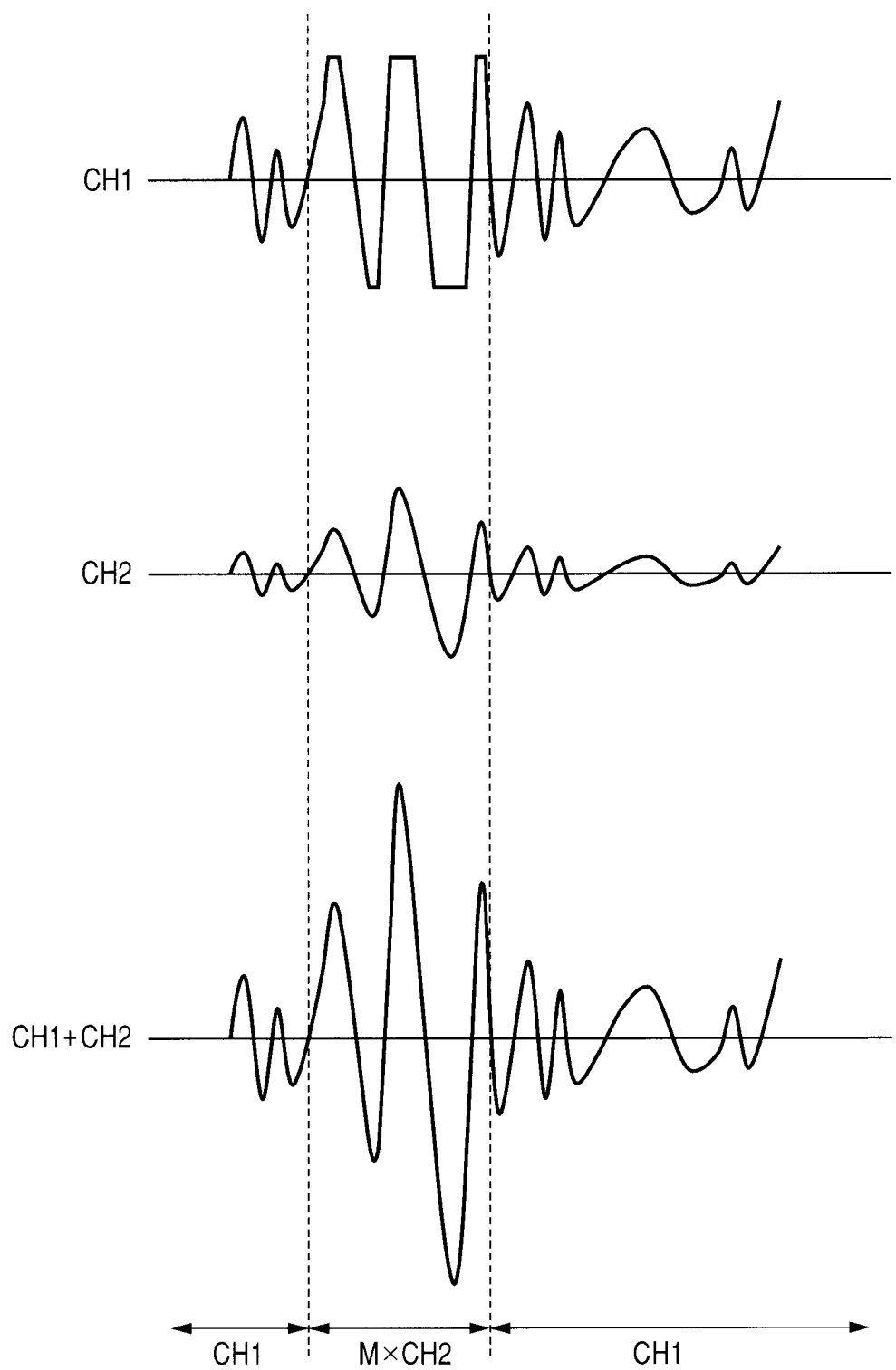
FIG. 21 is a waveform diagram showing exemplary waveforms recorded at the time of audio input signal clipping in the AD conversion system illustrated in FIG. 20.

In the AD conversion system shown in FIG. 20, an arithmetic circuit 20B performs attenuation rate calibration, similarly to the above-mentioned manner, on AD conversion result data that has been obtained from an AD conversion channel CH2 after attenuation to "1/M". The resultant data obtained through the attenuation rate calibration (CH2 Data) is multiplied by "M" for output. On the other hand, AD conversion result data obtained from an AD conversion channel CH1 (CH1 Data) is output in an intact state from the arithmetic circuit 20B. Then, under the control of a CPU 2, both the CH1 Data (corresponding to the AD conversion channel CH1) and the multiplied-by-"M" CH2 data (corresponding to the AD conversion channel CH2) output from the arithmetic circuit 20B are stored into a memory 41 in succession. In audio data recording control shown in FIG. 21, for example, the CPU 2 selects the CH1 Data corresponding to the AD conversion channel CH1 until a clipping takes place thereon. Upon occurrence of a clipping, the CPU 2 selects the multiplied-by –"M" CH2 Data corresponding to the AD conversion channel CH2.

While the invention made by the present inventors has been described in detail with respect to specific embodiments thereof, it is to be understood that the present invention is not limited by any of the details of description and that various changes and modifications may be made in the present invention without departing from the spirit and scope thereof.

For example, there may be provided a modified arrangement in which an offset of the ADC is canceled through use of a circuit configuration of the amplifier circuit concerned. In this case, the calculation represented by the expression "(Measured value−Ost)×Gexp/Gin" at step S35 is replaced with that represented by the expression "(Measured value)× Gexp/Gin". Further, the type of the amplifier circuit is not limited to PGA, and a gain-fixed type of an amplifier may be used instead thereof.

It is to be understood that the calculation methods for bit extension processing described with reference to FIGS. 3, 4 and 5 in the foregoing are for illustrative purposes only and are not intended to limit the scope of the present invention. In cases where enhancement in bit precision at another conversion range position is desired or where a different digital coding scheme is used, any suitable calculation method may be adopted accordingly.

Further, in bit-precision-variable AD conversion processing, it is not necessarily required to perform, "on an each-time basis", error cancellation calculation and "n"-bit extension calculation on AD conversion result for a signal amplified by the amplifier 5. There may be provided an arrangement wherein a look-up table for each calculation result is prepared in advance and wherein the prepared look-up table is accessed for AD conversion result acquisition through AD conversion index reference with respect to a signal amplified by the amplifier 5. Still further, it is to be recognized that the data processing device according to the present invention is not limited to an LSI device such as is represented by a single-chip microcomputer device and may be a multi-chip modular circuit, a circuit contained in a printed circuit board, or the like.

Furthermore, it will be obvious to those skilled in the art that multi-sampling can be performed even in cases where an attenuator is used. Not limited to dual-sampling operation, the technique of multi-sampling is applicable to such a circuit configuration that there are provided a plurality of amplifier circuits or attenuators, or combination thereof.

Still further, it is to be understood that the functions of the arithmetic circuit 20 described in the foregoing may be achieved by using a combination of the CPU 2 and operation programs thereof.

What is claimed is:

1. A data processing system comprising:
    a microcomputer; and
    an amplifier circuit,
    wherein the microcomputer comprises an AD converter circuit, a DA converter circuit, and a control circuit,
    wherein the control circuit is arranged to control calibration processing,
    wherein, in execution of said calibration processing under the direction of said control circuit, a gain (G) of said amplifier circuit is calculated,
    wherein a first voltage (x1) is applied from the DA converter circuit to the AD converter circuit and the AD converter circuit outputs a first AD conversion signal (y1), a second voltage (x2) is applied from the DA converter circuit to the AD converter circuit and the AD converter circuit outputs a second AD conversion signal (y2), the first voltage (x1) is applied from the DA converter circuit to the AD converter circuit through the amplifier circuit and the AD converter circuit outputs a third AD conversion signal (y3), the second voltage (x2) is applied from the DA converter circuit to the AD converter circuit through the amplifier circuit and the AD converter circuit outputs a fourth AD conversion signal (y4),
    wherein the gain (G) of the amplifier circuit is calculated as G=(y4−y3)/(y2−y1),
    wherein an offset (O) of the amplifier circuit is calculated as O=y2−y4/G=y1−y3/G,
    wherein AD conversion data (Z) is obtained through the amplifier circuit, and
    wherein error calibrated data (z) is calculated as z=Z/G−O.

2. The data processing system according to claim 1, wherein the amplifier circuit provides a gain value larger than "1."

3. The data processing system according to claim 1, wherein the amplifier circuit provides a gain value smaller than "1."

4. The data processing system according to claim 1, wherein the control circuit is arranged to control AD conversion processing, and, wherein, in execution of said AD conversion processing, an analog signal amplified by said amplifier circuit with respect to a prespecified analog signal under measurement is converted by the AD converter circuit, the prespecified analog signal under measurement is a small signal limited within a predetermined range with respect to a conversion range of the AD converter circuit.

* * * * *